(12) United States Patent
Sengoku et al.

(10) Patent No.: US 9,374,216 B2
(45) Date of Patent: Jun. 21, 2016

(54) MULTI-WIRE OPEN-DRAIN LINK WITH DATA SYMBOL TRANSITION BASED CLOCKING

(71) Applicant: QUALCOMM Incorporated, San Diego, CA (US)

(72) Inventors: Shoichiro Sengoku, San Diego, CA (US); Joseph Cheung, San Diego, CA (US); George Alan Wiley, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/220,056

(22) Filed: Mar. 19, 2014

(65) Prior Publication Data

US 2014/0286466 A1 Sep. 25, 2014

Related U.S. Application Data

(60) Provisional application No. 61/803,684, filed on Mar. 20, 2013, provisional application No. 61/846,977, filed on Jul. 16, 2013.

(51) Int. Cl.
*H04L 7/033* (2006.01)
*H03K 5/1534* (2006.01)
(Continued)

(52) U.S. Cl.
CPC .............. *H04L 7/033* (2013.01); *H03K 3/017* (2013.01); *H03K 5/13* (2013.01); *H03K 5/153* (2013.01);
(Continued)

(58) Field of Classification Search
CPC .................. H03K 5/1534; H03K 2005/00293; H03K 5/13; H03K 5/133; H03K 5/14; H03K 19/00; H03K 5/134; H03H 11/265; H04L 7/0037

USPC .......... 375/295, 316, 354; 327/153, 155, 158, 327/161, 172–176, 215, 217, 218, 284, 291, 327/298, 299
See application file for complete search history.

(56) References Cited

U.S. PATENT DOCUMENTS 4,280,221 A 7/1981 Chun et al.
4,644,547 A 2/1987 Vercellotti et al.
(Continued)

FOREIGN PATENT DOCUMENTS

DE 3329773 A1 2/1985
DE 102004013093 B3 7/2005
(Continued)

OTHER PUBLICATIONS

International Search Report and Written Opinion—PCT/US2014/031363—ISA/EPO—Jul. 2, 2014.
(Continued)

*Primary Examiner* — Daniel Washburn
*Assistant Examiner* — Eboni Hughes
(74) *Attorney, Agent, or Firm* — Loza & Loza, LLP

(57) ABSTRACT

A method, an apparatus, and a computer program product are described. The apparatus generates a receive clock signal for receiving data from a multi-wire open-drain link by determining a transition in a signal received from the multi-wire open-drain link, generating a clock pulse responsive to the transition, delaying the clock pulse by a preconfigured first interval if the transition is in a first direction, and delaying the clock by a preconfigured second interval if the transition is in a second direction. The preconfigured first and/or second intervals are configured based on a rise time and/or a fall time associated with the communication interface and may be calibrated by measuring respective delays associated with clock pulses generated for first and second calibration transitions.

31 Claims, 19 Drawing Sheets

(51) Int. Cl.
*H03K 3/017* (2006.01)
*H03K 5/153* (2006.01)
*H03L 7/081* (2006.01)
*H03K 5/13* (2014.01)
*H03K 5/134* (2014.01)
*H03K 19/00* (2006.01)
*H03K 5/14* (2014.01)
*H03K 5/00* (2006.01)
*H04L 7/00* (2006.01)

(52) U.S. Cl.
CPC ............ *H03K 5/1534* (2013.01); *H03L 7/081* (2013.01); *H03K 5/133* (2013.01); *H03K 5/134* (2014.07); *H03K 5/14* (2013.01); *H03K 19/00* (2013.01); *H03K 2005/00293* (2013.01); *H04L 7/0037* (2013.01)

(56) References Cited

U.S. PATENT DOCUMENTS

| | | | |
|---|---|---|---|
| 4,839,907 | A | 6/1989 | Saneski |
| 5,493,538 | A * | 2/1996 | Bergman .................. 365/233.5 |
| 5,703,914 | A | 12/1997 | Nakamura |
| 5,862,180 | A | 1/1999 | Heinz |
| 5,959,568 | A | 9/1999 | Woolley |
| 6,320,406 | B1 | 11/2001 | Morgan et al. |
| 6,320,437 | B1 * | 11/2001 | Ma .............................. 327/175 |
| 6,526,112 | B1 | 2/2003 | Lai |
| 6,556,628 | B1 | 4/2003 | Poulton et al. |
| 6,624,766 | B1 | 9/2003 | Possley et al. |
| 6,728,908 | B1 | 4/2004 | Fukuhara et al. |
| 6,836,522 | B1 | 12/2004 | Wakayama |
| 6,874,097 | B1 | 3/2005 | Aliahmad et al. |
| 6,933,866 | B1 | 8/2005 | Weitz |
| 7,061,939 | B1 | 6/2006 | Chengson et al. |
| 7,076,377 | B2 | 7/2006 | Kim et al. |
| 7,167,527 | B1 | 1/2007 | Park et al. |
| 7,190,754 | B1 | 3/2007 | Chang et al. |
| 7,339,502 | B2 | 3/2008 | Furtner |
| 7,358,869 | B1 | 4/2008 | Chiarulli et al. |
| 7,395,347 | B2 | 7/2008 | Nemawarkar et al. |
| 7,463,680 | B2 | 12/2008 | Buckwalter et al. |
| 7,502,953 | B2 | 3/2009 | Boecker et al. |
| 7,667,500 | B1 * | 2/2010 | Alfke .............................. 327/34 |
| 7,715,509 | B2 | 5/2010 | Stojanovic et al. |
| 7,741,876 | B2 | 6/2010 | Fusayasu et al. |
| 7,781,677 | B2 | 8/2010 | Matsubara et al. |
| 7,983,347 | B2 | 7/2011 | Hamada et al. |
| 8,000,412 | B1 | 8/2011 | Loinaz |
| 8,159,376 | B2 | 4/2012 | Abbasfar |
| 8,184,760 | B2 | 5/2012 | Chien et al. |
| 8,264,253 | B2 | 9/2012 | Tian et al. |
| 8,284,848 | B2 | 10/2012 | Nam et al. |
| 8,446,903 | B1 | 5/2013 | Ranganathan et al. |
| 8,621,128 | B2 | 12/2013 | Radulescu et al. |
| 8,649,460 | B2 | 2/2014 | Ware et al. |
| 8,659,957 | B2 | 2/2014 | Sekine |
| 8,686,754 | B2 | 4/2014 | Chopra et al. |
| 8,848,810 | B2 | 9/2014 | Lee et al. |
| 9,071,220 | B2 | 6/2015 | Sengoku et al. |
| 9,203,599 | B2 | 12/2015 | Sengoku |
| 2004/0203559 | A1 | 10/2004 | Stojanovic et al. |
| 2005/0053171 | A1 | 3/2005 | Pickering et al. |
| 2005/0069071 | A1 | 3/2005 | Kim et al. |
| 2005/0104649 | A1 | 5/2005 | Yonezawa |
| 2005/0140415 | A1 * | 6/2005 | Hazucha et al. .............. 327/276 |
| 2005/0218953 | A1 * | 10/2005 | Slawecki ....................... 327/276 |
| 2006/0006902 | A1 | 1/2006 | Sagiv |
| 2006/0061494 | A1 | 3/2006 | Hosaka et al. |
| 2006/0132335 | A1 | 6/2006 | Kojima |
| 2007/0073932 | A1 | 3/2007 | Pike et al. |
| 2007/0188187 | A1 | 8/2007 | Oliva et al. |
| 2007/0241836 | A1 | 10/2007 | Miller |
| 2008/0063127 | A1 | 3/2008 | Hayashi et al. |
| 2008/0159432 | A1 * | 7/2008 | Ng ................................. 375/295 |
| 2008/0165732 | A1 | 7/2008 | Kim et al. |
| 2008/0212709 | A1 | 9/2008 | Wiley et al. |
| 2009/0080584 | A1 | 3/2009 | Hamano et al. |
| 2009/0195699 | A1 | 8/2009 | Hamada et al. |
| 2009/0243681 | A1 | 10/2009 | Zerbe et al. |
| 2010/0001758 | A1 | 1/2010 | Dreps et al. |
| 2010/0002819 | A1 | 1/2010 | Conner |
| 2010/0027607 | A1 | 2/2010 | Kwasniewski et al. |
| 2010/0040169 | A1 | 2/2010 | Abbasfar |
| 2010/0111207 | A1 | 5/2010 | Suda et al. |
| 2010/0180143 | A1 | 7/2010 | Ware et al. |
| 2010/0264967 | A1 | 10/2010 | Lee, Jr. et al. |
| 2011/0013707 | A1 | 1/2011 | Walker et al. |
| 2011/0176646 | A1 | 7/2011 | Pal et al. |
| 2011/0197086 | A1 | 8/2011 | Rivoir |
| 2011/0216863 | A1 | 9/2011 | Tomita et al. |
| 2011/0249781 | A1 | 10/2011 | Guillot |
| 2012/0020660 | A1 | 1/2012 | Le Taillandier De Gabory et al. |
| 2012/0213299 | A1 | 8/2012 | Cronie et al. |
| 2012/0223754 | A1 * | 9/2012 | Lewis ........................... 327/158 |
| 2012/0224656 | A1 | 9/2012 | Aoki |
| 2013/0225067 | A1 | 8/2013 | Card et al. |
| 2013/0241759 | A1 | 9/2013 | Wiley et al. |
| 2013/0279551 | A1 | 10/2013 | Fujimori et al. |
| 2013/0294490 | A1 | 11/2013 | Chandrasekaran et al. |
| 2014/0009633 | A1 | 1/2014 | Chopra et al. |
| 2014/0254732 | A1 | 9/2014 | Sengoku et al. |
| 2014/0254733 | A1 | 9/2014 | Sengoku et al. |
| 2014/0270026 | A1 | 9/2014 | Sengoku et al. |
| 2014/0286389 | A1 | 9/2014 | Zerbe et al. |
| 2014/0348214 | A1 | 11/2014 | Sengoku et al. |
| 2015/0043358 | A1 | 2/2015 | Wiley et al. |
| 2015/0098536 | A1 | 4/2015 | Sengoku |
| 2015/0098537 | A1 | 4/2015 | Sengoku |
| 2015/0098538 | A1 | 4/2015 | Wiley et al. |
| 2015/0220472 | A1 | 8/2015 | Sengoku |
| 2016/0028534 | A1 | 1/2016 | Sengoku |
| 2016/0065357 | A1 | 3/2016 | Sengoku |

FOREIGN PATENT DOCUMENTS

| | | |
|---|---|---|
| EP | 1385306 A1 | 1/2004 |
| GB | 2456517 A | 7/2009 |
| JP | 2008242884 A | 10/2008 |
| WO | WO-2007009038 A2 | 1/2007 |
| WO | WO-2008109478 A2 | 9/2008 |
| WO | WO-2008151251 A1 | 12/2008 |
| WO | WO-2009086078 A1 | 7/2009 |
| WO | WO-2009111175 A1 | 9/2009 |

OTHER PUBLICATIONS

Bell A G., et al., "WAM 7.1: A Single Chip NMOS Ethernet Controller", IEEE: International Solid-State Circuits Conference, XX, XX, Feb. 23, 1983, XP001 039599, pp. 13-78.

Muller P., et al., "Top-Down Design of a Low-Power Multi-Channel 2.5-Gbit/s/Channel Gated Oscillator Clock-Recovery Circuit", Design, Automation and Test in Europe, 2005. Proceedings Munich, Germany March 7-11, 2005, Piscataway, NJ, USA, IEEE, Mar. 7, 2005, pp. 258-263, XP010779962, ISBN: 978-0-7695-2288-3.

Vitesse, "VSC7226 Quad 3.125Gb/s Backplane Transceiver," Vitesse Semiconductor Corporation, PB-VSC7226-002, 2002, 2 Pages.

"Draft MIPI Alliance Specification for Camera Serial Interface 2 (CSI-2)" In:"Draft MIPI Alliance Specification for Camera Serial Interface 2 (CSI-2)", Apr. 2, 2009, XP055165978, 6. Camera Control Interface (CCI) 529-728.

"MIPI Alliance Specification for D-PHY," Sep. 22, 2009, pp. 1-125, XP055057664 [Retrieved on Mar. 25, 2013].

Poulton J W., et al., "Multiwire Differential Signaling", 20030806 No. 1.1 Aug. 6, 2003, pp. 1-20, XP002610849, Retrieved from the Internet: URL:http://www.cs.unc.edu/-jpfmwire.pdf [retrieved on Nov. 23, 2010] the whole document.

(56) References Cited

OTHER PUBLICATIONS

Williams A., "Synopsys describes MIPI DigRF protocol for 4G mobile," Retrieved from the Internet <URL: http://www.electronicsweekly.com/news/design/eda-and-ip/synopsys-describes-mipi-digrf-protocol-for-4g-mobile-2012-03/ >, 2012, 6 Pages.

Zhu C., et al., "Multi-Machine Communication Based on I2C-Bus," Sensors & Transducers, Jul. 2014, vol. 174 (7), pp. 138-143.
Zogopoulos S., et al., "High-Speed Single-Ended Parallel Link Based on Three-Level Differential Encoding", IEEE Journal of Solid-State Circuits, IEEE Service Center, Piscataway, NJ, USA, vol. 44, No. 2, Feb. 1, 2009, pp. 549-557, XP011243176, ISSN: 0018-9200, DOI: 10.1109/JSSC.2008.2011038 the whole document.

* cited by examiner

Sequential Symbol Number

| Previous symbol Ps | Current symbol Cs | Transition number T |
|---|---|---|
| 0 | 1 | 1 |
|   | 2 | 2 |
|   | 3 | 0 |
| 1 | 2 | 1 |
|   | 3 | 2 |
|   | 0 | 0 |
| 2 | 3 | 1 |
|   | 0 | 2 |
|   | 1 | 0 |
| 3 | 0 | 1 |
|   | 1 | 2 |
|   | 2 | 0 |

502

504

TX: T to S $T_{tmp} = T==0\ ?\ 3 : T$
$Cs = Ps + T_{tmp}$

RX: S to T $T_{tmp} = Cs + 4 - Ps$
$T = T_{tmp}==3\ ?\ 0 : T_{tmp}$

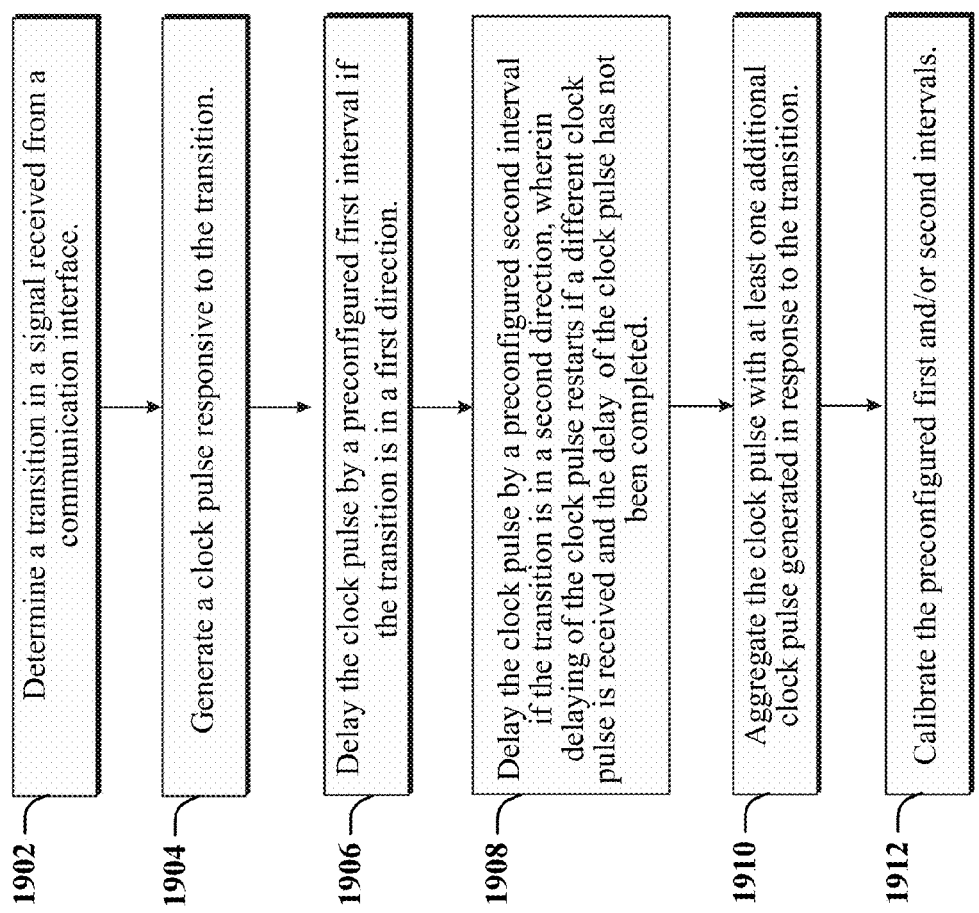

MULTI-WIRE OPEN-DRAIN LINK WITH DATA SYMBOL TRANSITION BASED CLOCKING

CLAIM OF PRIORITY UNDER 35 U.S.C. §119

The present Application for Patent claims priority to U.S. Provisional Application No. 61/803,684 entitled "Multi-Wire Open-Drain Link With Data Symbol Transition Based Clocking", filed Mar. 20, 2013, and U.S. Provisional Application No. 61/846,977 entitled "Multi-Wire Open-Drain Link With Data Symbol Transition Based Clocking", filed Jul. 16, 2013, both assigned to the assignee hereof and hereby expressly incorporated by reference herein.

FIELD

The present disclosure relates generally to data communications, and more particularly, clock recovery from symbol transitioning over multi-wire open-drain links.

BACKGROUND

Most single-ended source synchronous open-drain communication interfaces, such as I2C, use a dedicated clock or strobe signal line to send cycle timing information from a transmitter to a receiver. Certain disadvantages are associated with these signaling systems, including a requirement for one extra signal dedicated for clock information. Maximum data rate is often limited when single-rate signaling is used such that one data symbol sent for each full clock period consisting of a clock high and clock low cycle, whereby the maximum data rate is often limited by a maximum allowed frequency of the system clock rather than the maximum allowed frequency of the data line. The maximum data rate is also often limited by skew between the clock and data that can be hard to control for optimal signaling.

In some instances, to avoid the use of a dedicated clock line, a clock may be embedded by guaranteeing symbol-to-symbol transitions within transmitted data symbols. Thus, a receiver device may extract clock information from the detection of symbol-to-symbol transitions. However, reliable or consistent detection of transitions by a receiver's logic may be affected by rise times and fall times of the transmitted signal. 1

Unlike complementary metal-oxide-semiconductor (CMOS) push-pull drivers, open-drain type drivers have a signal rise time that is significantly longer than a signal fall time. This difference in rise and fall times for open-drain type drivers poses a problem for clock recovery from transmitted data symbols as some transitions may be missed.

Therefore, a solution is needed that permits extracting a clock from transmitted data symbols without slowing down the data transmission rate.

SUMMARY

Embodiments disclosed herein provide systems, methods and apparatus for communicating between two devices that may be collocated in an electronic apparatus and communicatively coupled through one or more data links.

According to one feature, a method for generating a clock signal comprises determining a transition in a signal received from a communication interface, generating a clock pulse responsive to the transition, delaying the clock pulse by a preconfigured first interval if the transition is in a first direction, and delaying the clock pulse by a preconfigured second interval if the transition is in a second direction. For instance, a transition is a rising transition (low-to-high), the clock pulse may be delayed for the first interval. If the transition is a falling transition (high-to-low), the clock pulse may be delayed for the first interval plus the second interval (or, alternatively, the second interval may simply be longer than the first interval). Delaying the clock pulse may restart if a different clock pulse is received and the delay of the clock pulse has not been completed. The preconfigured first and/or second intervals may be configured based on a rise time and/or a fall time associated with the communication interface. The rise time may correspond to a rise time associated with an open-drain transistor. The preconfigured first and/or second intervals may be selected to cause the clock pulse to occur when a symbol is transmitted on the communication interface, thereby permitting the symbol to be reliably sampled. In one example, the fall time of a second transition plus the first and second intervals (first and second delays) may be selected to be substantially equal to the rise time of a first transition plus the preconfigured first interval (e.g., first delay). For instance, the second interval may be selected to match a delay (difference between rise time and fall time) in detecting a transition attributed to the rise time. The preconfigured first interval may be selected to match a delay in detecting the transition attributed to the fall time. The clock pulse may be aggregated with at least one additional clock pulse generated in response to the transition.

The preconfigured first and/or second intervals may be calibrated. For instance, the preconfigured first and/or second intervals may be calibrated by providing first and second calibration transitions that are in different directions from one another, measuring respective delays associated with clock pulses generated for the first and second calibration transitions, and modifying the preconfigured first and/or second intervals to minimize a difference in the respective delays. For example, the preconfigured first interval may be modified or set by adjusting a programmed delay of a first delay circuit based on a measured delay associated with a clock pulse generated after the first calibration transition. The preconfigured second interval may be modified or set by adjusting a programmed delay of a second delay circuit based on a measured delay associated with a clock pulse generated after the second calibration transition. The respective delays may be measured using a timer that reflects a desired delay associated with clock pulses generated for either calibration transition.

BRIEF DESCRIPTION OF THE DRAWINGS

FIG. 19 illustrates a method for reliably generating a clock signal from symbol transitions.

DETAILED DESCRIPTION

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

Overview

A method and device are provided for generating a clock signal from received symbol transitions. A signal is received over a multi-wire open-drain link. Transitions within the received signal are determined from the negative-to-positive (i.e., low-to-high) transitions and positive to negative (i.e., high-to-low) transitions of symbols within the signal. A clock pulse is generated responsive to the transition. The clock pulse is selectively delayed by a preconfigured first interval (e.g., first delay) if the transition is in a first direction (e.g., rising transition). The clock pulse may be further selectively delayed by a preconfigured second interval (second delay) if the transition is in a second direction (falling transition). For instance, the first direction may be from low-to-high, and the second direction is from high-to-low. The preconfigured second interval may be configured based on a rise time and/or a fall time associated with the communication interface and may be calibrated by measuring respective delays associated with clock pulses generated for first and second calibration transitions.

Exemplary Operating Environment(s)

Figure 1:
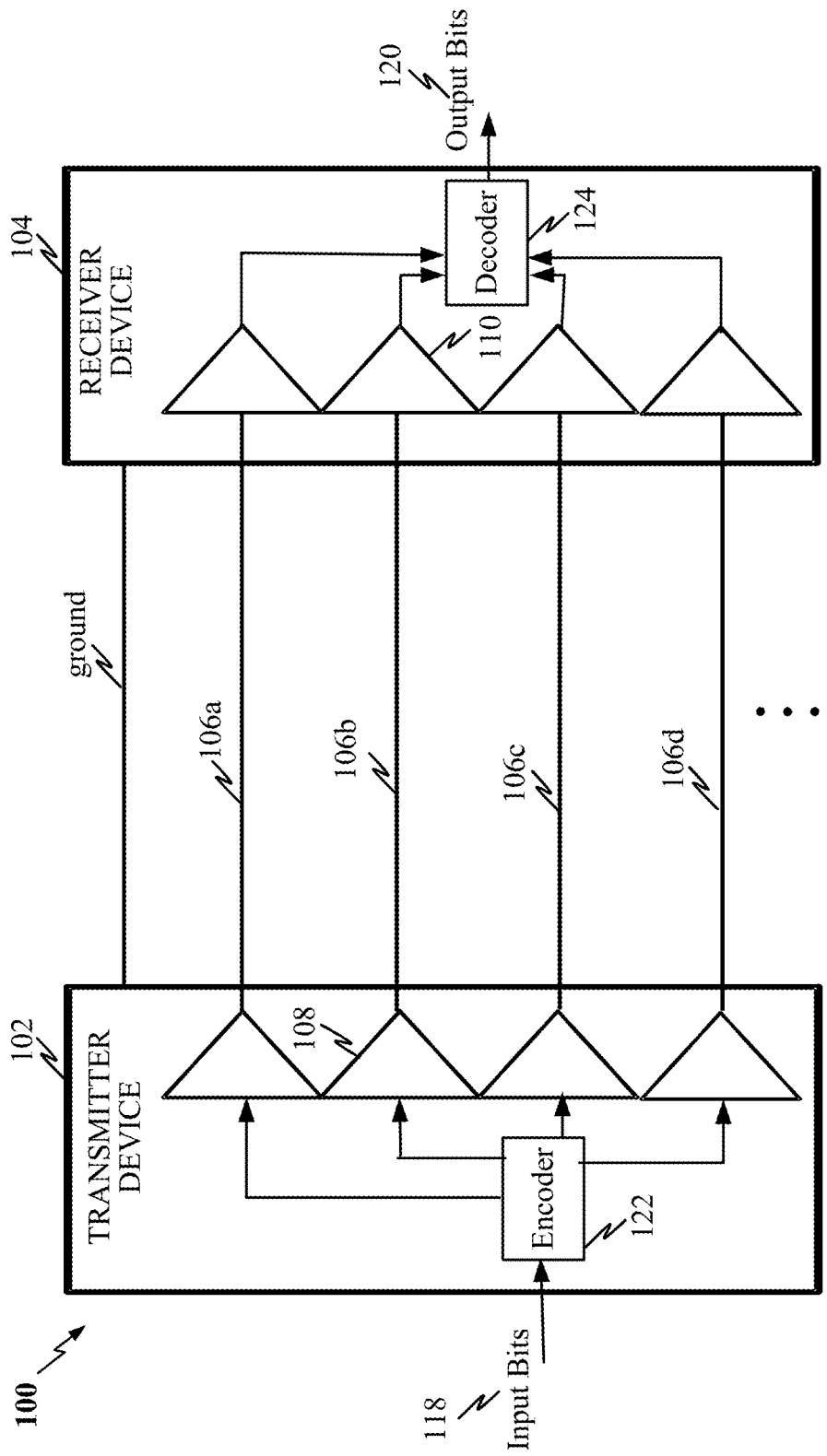
FIG. 1 depicts a single-ended signaling system.

FIG. 1 illustrates a single-ended signaling system. In single-ended signaling, one wire carries a varying voltage that represents the signal, while another wire may be connected to a reference voltage (e.g., ground). A transmitter device 102 may include a plurality of single-ended open-drain (transistor) drivers 108, each driver 108 coupled to a single wire/conductor 106a, 106b, 106c, and/or 106d. A receiver device 104 may include one or more single-ended CMOS (transistor) receivers 110, each single-ended receiver 110 coupled to a single wire/conductor 106a, 106b, 106c, and/or 106d. The transmitter device 102 receives input bits 118, encodes them (at encoder 122) into single-ended signals, and transmits them to the receiver 104 as single-ended signals through the single-ended drivers 108 via each wire/conductor 106a, 106b, 106c, and/or 106d. The receiver device 104 receives the single-ended signals via each wire/conductor 106a, 106b, 106c, and/or 106d through the single-ended receivers 110, decodes the single-ended signals (at decoder 124), and provides output bits 120. In this single-ended system, the decoder 124 may include a clock and data recovery (CDR) such that a clock signal is extracted from one or more received single-ended signals.

Figure 2:
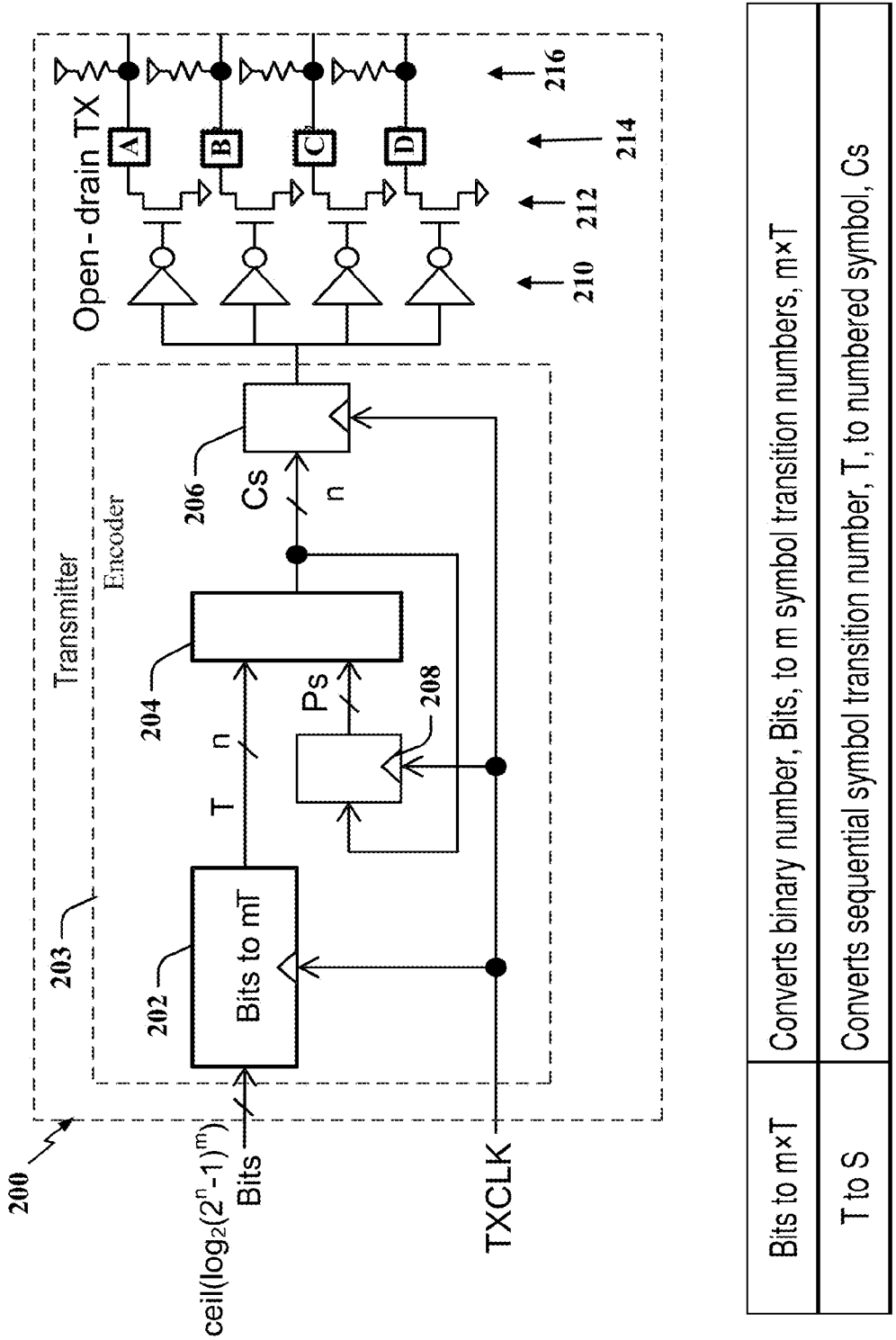
FIG. 2 is a block diagram of a transmitter device with open-drain drivers and in which a clock is integrated into symbol transitions.

FIG. 2 is a block diagram of a transmitter device 200 with open-drain drivers in which a clock is integrated into symbol transitions. The transmitter device 200 may include an encoder 203 comprising a bits-to-symbol transition numbers converter 202, a symbol transition numbers converter-to-sequential symbol number converter 204, and clocked registers 206 and 208. Input data is converted by the bits-to-symbol transition numbers converter 202 from a binary number or stream (bits) to m symbol transition numbers, (m×T). The symbol transition number-to-sequential symbol number converter 204 may convert symbol transition numbers (T) to a sequential symbol number (Cs). The sequential symbol number (Cs) may be clocked through an output register 206 to a set of buffers 210 that control a plurality of line drivers 212. In one example, line drivers 212 may be implemented using open-drain transistors that are pulled up by resistances 216. A delay register 208 serves to hold a previous sequential symbol number (Ps). The symbol transition number-to-sequential symbol number converter 204 uses a current symbol transition number T and a previous sequential symbol number (Ps) to select the next current sequential number (Cs).

Figure 3:
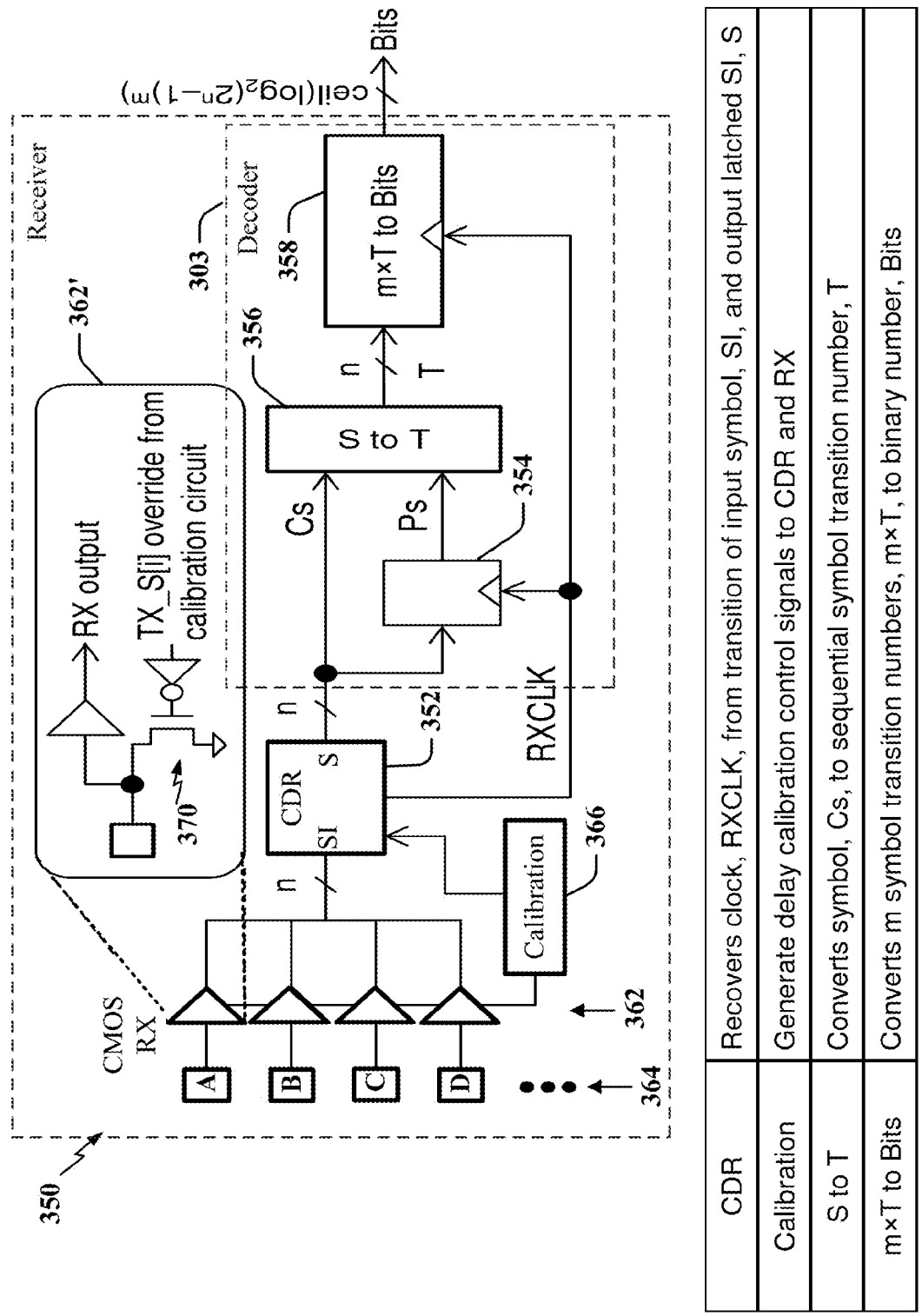
FIG. 3 is a block diagram of a receiver device with CMOS receivers and with integrated clock recovery.

FIG. 3 is a block diagram of a receiver device 350 with CMOS receivers and with integrated clock recovery. The receiver device 350 may include a plurality of complementary metal-oxide-semiconductor (CMOS) receive buffers 362 that receive signals from n wires 364.

The receiver device 350 may include a decoder 303 comprising a clocked hold register 354, a sequential symbol number-to-symbol transition number converter 356, and a symbol transition number-to-bits converter 358. The received signals may be provided to a clock and data recovery (CDR) circuit 352 that recovers a receive clock (RXCLK) from transitions of an input symbol (SI) received over wires 364. The sequential symbol number-to-symbol transition number converter 356 converts a current symbol Cs based on a previous symbol Ps (which is held at the hold register) to provide a symbol transition number T. The hold register 354 is clocked by the receive clock (RXCLK) provided by the CDR circuit 352. The symbol transition number-to-bits converter 358, triggered by the receive clock (RXCLK), then converts m symbol transition numbers (m×T) to a binary number. A calibration circuit 366 may serve to generate delay calibration control signals for the CDR circuit 352 and CMOS receive buffers 362.

Exemplary Conversion Between Bits and Symbol Transition Numbers

Figure 4:
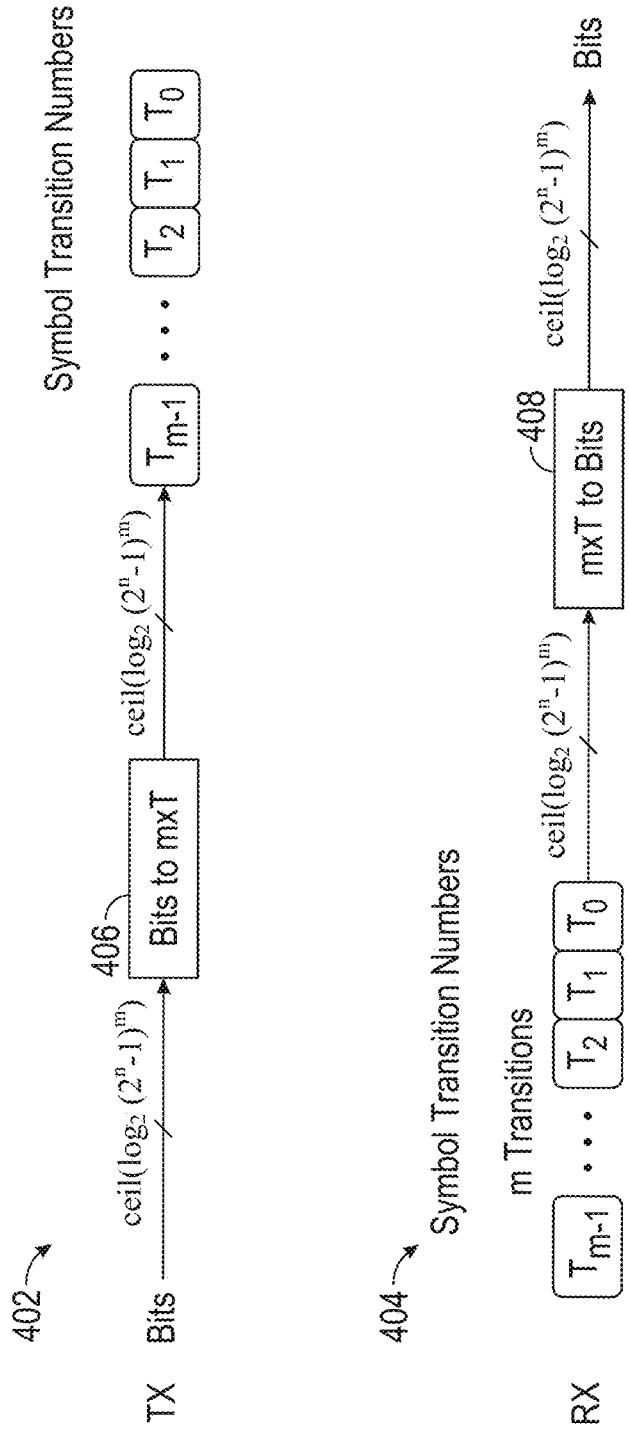
FIG. 4 illustrates the conversion from bits to symbol transition numbers at a transmitter and then from symbol transition numbers to bits at a receiver.

FIG. 4 illustrates the conversion from bits to symbol transition numbers at a transmitter 402 and then from symbol transition numbers to bits at a receiver 404. The transmitter 402 feeds binary information, Bits, into a "Bits to m×T" converter 406 to generate m symbol transition numbers, T0 to Tm−1. The receiver 404 receives m symbol transition numbers, T0 to Tm−1, which are fed into a "m×T to Bits" converter 408 to retrieve the binary information, Bits. If there are r possible symbol transition states per one T, T0 to Tm−1, m transitions can send $r^m$ different states.

In one example, it may be assumed the possible symbol transition per one T, r is 10. Lets also assume the number of symbols in a group, m is 3, such that the symbol transition number is T2, T1, T0, where Ti: 0, 1, 2, . . . , 9. Thus, each T can have 10 different states. Thus, the symbol transition number for T2, T1, T0 may be for example, a 3-digit number, such as T2=3, T1=9, T0=1 (or the decimal number 391). In this manner a sequence of bits may be converted into a plurality of symbol transition numbers T and vice versa.

Exemplary Conversion Between Sequential Symbols and Symbol Transition Number

Figure 5:
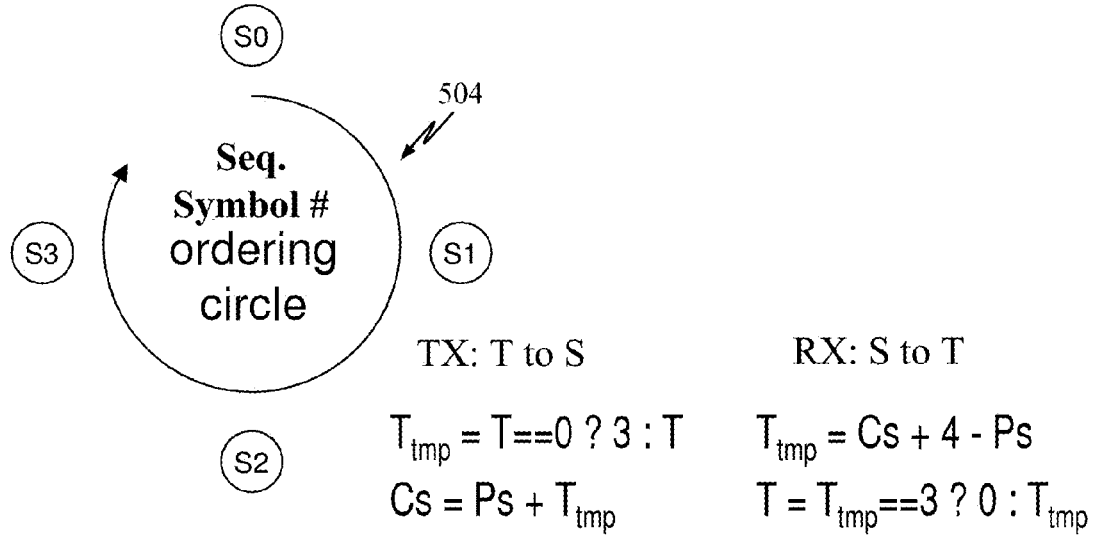
FIG. 5 illustrates the conversion between sequential symbols and symbol transition numbers.

FIG. 5 illustrates the conversion between sequential symbols and transition numbers. This conversion maps each transition from a previous sequential symbol number (Ps) to a current sequential symbol (Cs) to a transition number (T). At the transmitter device, the transition numbers are being converted to sequential symbols. Because of the relative conversion scheme being used, the transition numbers guarantee that no two consecutive sequential symbols 504 will be the same.

In one example for a 2-wire system, there are four (4) raw symbols assigned to 4 sequential symbol S0, S1, S2, and S3. For the four (4) sequential symbols, Table 502 illustrates how a current sequential symbol (Cs) may be assigned based on a previous sequential symbol (Ps) and a temporary transition number $T_{tmp}$ based upon the current transition number (T).

In this example, the transition number $C_s$ may be assigned according to:

$$Cs = Ps + T_{tmp}$$

where $T_{tmp}$=T==0 ? 3: T. Alternatively stated, if T is equal to zero, $T_{tmp}$ becomes 3, else $T_{tmp}$ becomes equal to T. And once $T_{tmp}$ is calculated, Cs is set to Ps plus $T_{tmp}$. Moreover, on the receiver end, the logic is reversed to recover T, $T_{tmp}$=$C_s$+ 4−$P_s$ and T=$T_{tmp}$==3 ? 0: $T_{tmp}$.

Exemplary Open-Drain Transistor Timing

As previously noted, the transmitter device 200 of FIG. 2 and the receiver device 350 of FIG. 3 use open-drain transistors for their drivers and receivers.

Figure 6:
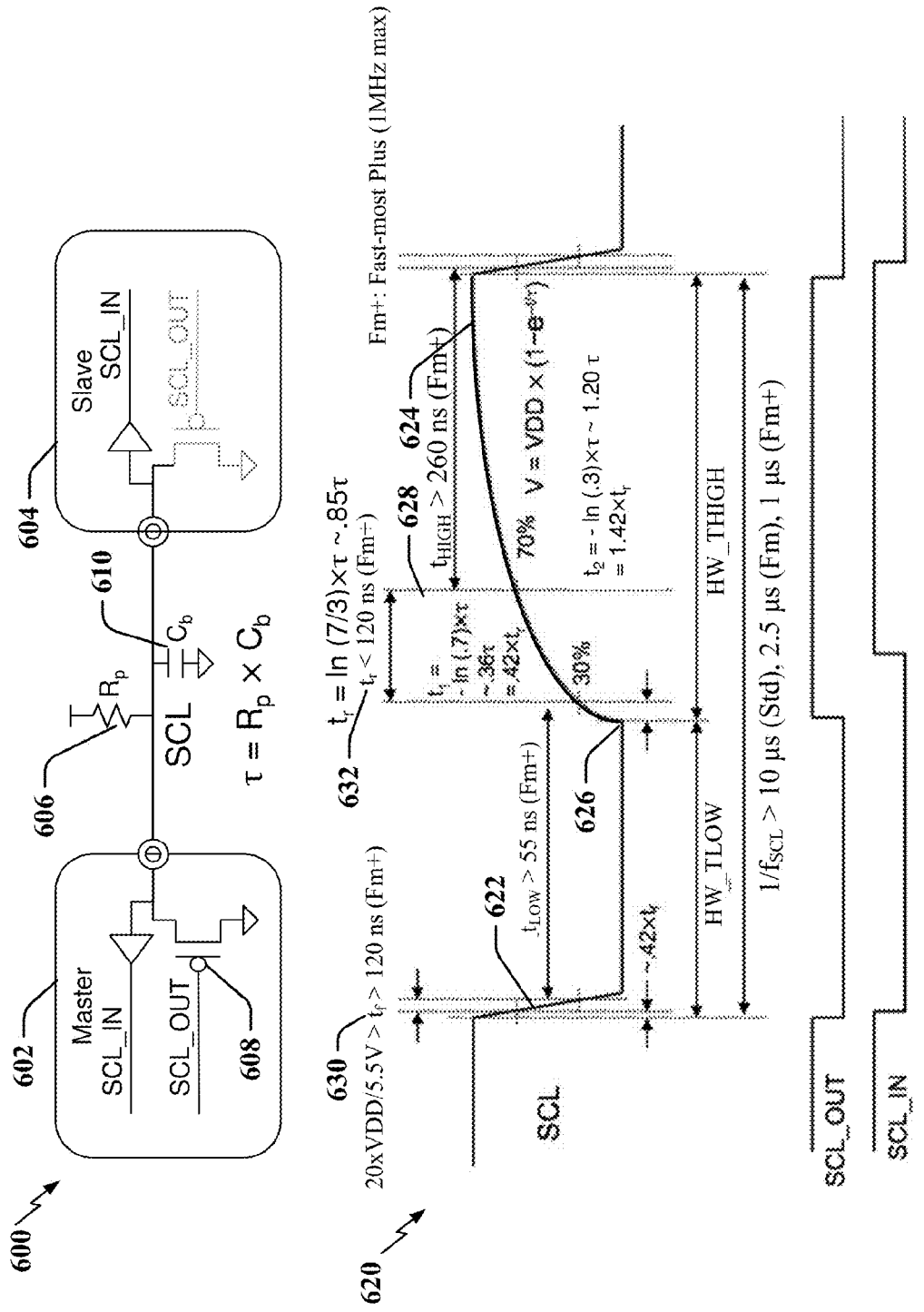
FIG. 6 illustrates timing of signals associated with open-drain transistors.

FIG. 6 illustrates exemplary timing of signals associated with open-drain transistors. In one example, a serial clock (SCL) driver in an Inter-Integrated Circuit (I2C) may comprise an open-drain transistor 608. When transmitting, a master device 602 may switch an open drain transistor 608 between high impedance and ground (or a voltage rail). A resistance 606 may be provided to pull the output to a desired voltage level when the open-drain transistor 608 is in high impedance state. The rate of change of the signal between voltages on the transmission line corresponding to logic 0 and logic 1 is governed by the resistance-capacitance (RC) constant associated with the resistance 606 and line capacitance 610 when the transistor 608 is in a high impedance state. In this example, it can be appreciated that the rise time $t_r$ 632 for the open-drain transistor 608 is significantly longer than its fall time $t_f$ 630. A characteristic timing diagram 620 illustrates that a low-to-high transition 624 (e.g., rising edges) are significantly more gradual (e.g., longer) for transitions than a high-to-low transition 622 from the logic 1 voltage to the logic 0 voltage (e.g., falling edge). A consequence of the difference in high-to-low transitions 622 (fall time) versus low-to-high transitions 624 (rise time) is that detection logic may ascertain a low-to-high transition at a time 628 that is significantly longer than a time to ascertain a high-to-low transition. That is, the time delay from the beginning of the low-to-high transition 626 to the time 628 at which the high state is ascertained is significantly greater or longer than the time delay for ascertaining a low state in a high-to-low transition 622. This has the tendency of slowing down transfer rates.

Figure 7:
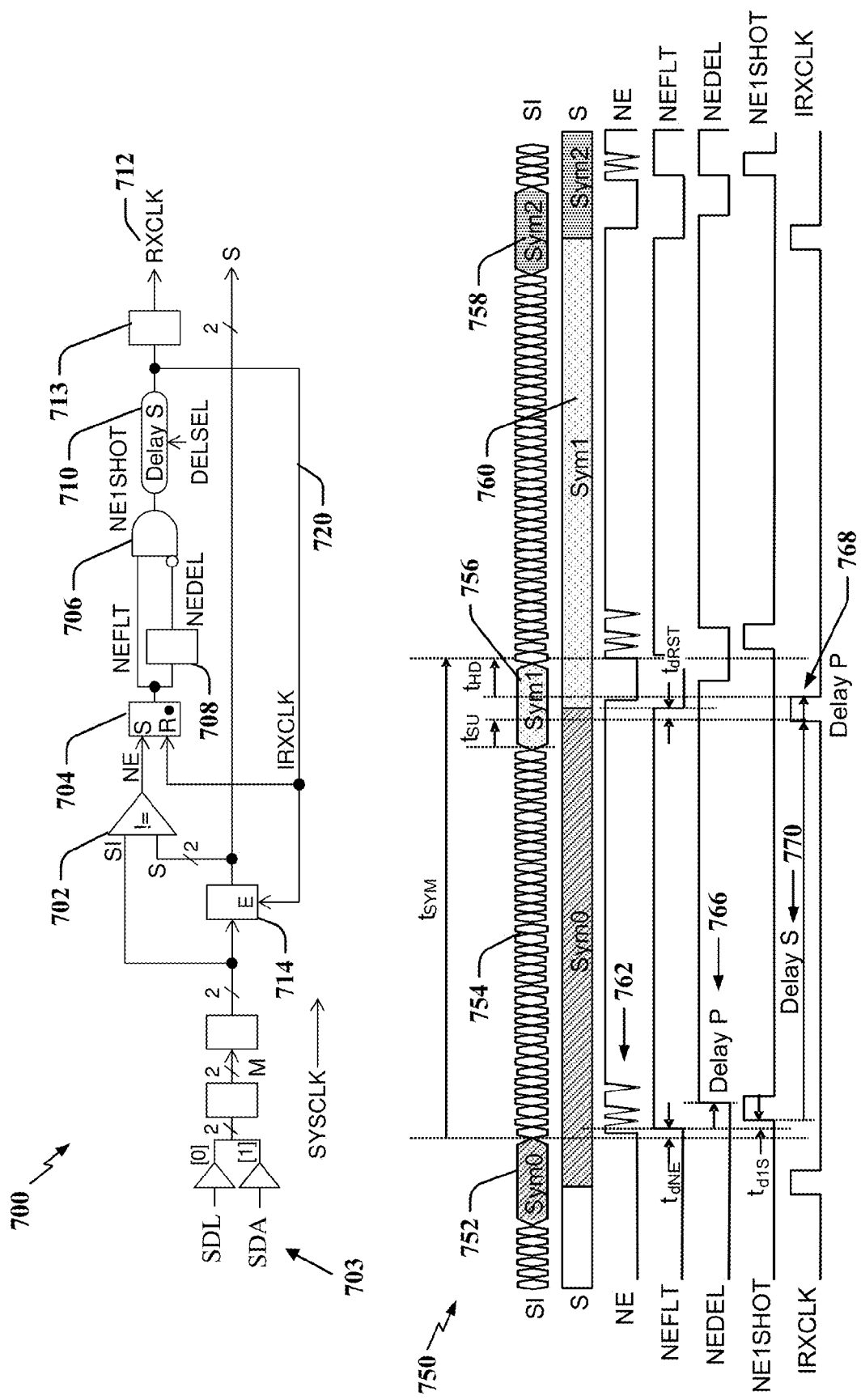
FIG. 7 illustrates an example of a clock recovery circuit used in a clock and data recovery (CDR) circuit and a corresponding timing diagram.

FIG. 7 illustrates an example of a clock recovery circuit 700 used in a CDR circuit and a corresponding timing diagram 750. The clock recovery circuit 700 can extract a receive clock (RXCLK) 712 from one or more signals transmitted over input lines/wires SLD and SDA 703. The clock recovery circuit 700 may detect a transition in symbols represented by the state of the input lines 703 and generates a pulse that is aligned relative to the transition in order to permit sampling of the current received symbol.

The clock recovery circuit 700 detects symbol transitions using a comparator 702, which compares current symbol (Cs) with the prior symbol (Ps) maintained by a hold register 714 and produces an output (NE) indicating whether a difference is detected. The NE signal is generated when the symbol is not equal to a registered copy of the symbol. The output of the comparator 702 sets a set-reset register 704 to record the transition. The output of the set-reset register 704 is gated with an inverted delayed version of itself at a one-shot logic gate 706, to produce a one-shot pulse (NE1SHOT). The width (P) of the NE1SHOT pulse is determined by a flip-flop based delay device 708 (which may operate as a programmable or configurable first delay). The NE1SHOT pulse may be further delayed by a time determined by a second delay circuit S 710 to provide a resultant clock IRXCLK 720 that enables reliable sampling of the current symbol. The clock IRXCLK 720 may be used to clock symbols into the hold register 714 and to clear the set-reset register 704 that records occurrence of a transition. A second flip flop circuit 713 may serve to hold (delay) the clock IRXCLK 720 and generate a second clock RXCLK 712 that may serve to sample received symbols.

The clock recovery circuit 700 assumes that at least one transition occurs at every symbol interval. However, transitions at one symbol interval may comprise only positive transitions or only negative transitions. This can cause some asymmetric timing when open-drain transistor drivers are used on wires 703.

In a more detailed example, clock recovery 700 includes the comparator 702, a set-reset register 704, the first analog or digital delay device 708 (e.g., a flip-flop based circuit), the one-shot logic gate 706, the second analog or digital delay device 710, and the hold register 714. The comparator 702 may compare a first instance of the first state transition signal (SI) and a level-latched instance of the first state transition signal (S) and outputs a comparison signal (NE). The set-reset register 704 may receive the comparison signal (NE) from the comparator 702 and outputs a filtered version of the comparison signal (NEFLT). The first delay device 708 (e.g., a flip-flop based circuit) may receive the filtered version of the comparison signal (NEFLT) and outputs a delayed instance of the filtered version of the comparison signal (NEDEL). The one-shot logic 706 may receive the filtered comparison signal (NEFLT) and the delayed instance of the filtered version of the comparison signal (NEDEL) and outputs a second filtered version of the comparison signal (NE1SHOT). The second delay device 710 may receive the second filtered version of the comparison signal (NE1SHOT) and outputs a delayed instance of the first state transition signal (RXCLK) 720. The set-reset register 704 may be reset based on the delayed instance of the first state transition signal (IRXCLK) 720. The hold register 714 may receive the first state transition signal (SI) and outputs the registered instance of the first state transition signal (S), where the hold register 714 is triggered based on the delayed instance of the first state transition signal (IRXCLK).

As can be appreciated from the timing diagram 750, the small delay P 766 introduced (e.g., by a flip flop circuit 708) provides more margins for setup time between symbols.

The following definitions are used in the timing diagram 750 signal:

$t_{sym}$: one symbol cycle period,
$t_{SU}$: setup time of SI for the registers 714 referenced to the rising (leading) edge of IRXCLK 720,
$t_{HD}$: hold time of SI for the registers 714 referenced to the falling (trailing) edge of IRXCLK 720,
$td_{HD}$: propagation delay of the comparator 702,
$td_{RST}$: reset time of the set-reset register 704 from the rising (leading) edge of IRXCLK 720,
$td_{1S}$: propagation delay of the one-shot logic 706.

Initially, signals SI and S hold the previous symbol value Sym0 752. Signals NE, NEFLT, and IRXCLK are zero. When a new symbol value Sym1 756 is being received, it causes signal SI to start changing its value. The SI value may be different from Sym1 756 (valid data) due to the possibility of receiving intermediate or indeterminate states 754 of the signal transition (from Sym0 to Sym1) that may be caused, for example, by inter-wire skew, over/under shoot, cross-talk, etc.

The NE signal becomes high as soon as the comparator 702 detects different value between SI and S, and that asynchronously sets the set-reset register 704 output, NEFLT signal, high after $td_{NE}$, which hold its high state until it is reset by a high state of IRXCLK 720 which will arrive approximately a Delay period S (caused by delay S 710) after rising of NEFLT signal.

The intermediate states at SI (invalid data) may contain a short period of symbol value Sym0 752 causing the comparator 702 output NE signal to turn back low for short period (spikes 762 in the NE signal). The low state of the NE signal will not affect the set-reset register 704 output, NEFLT signal, since the set-reset register 704 effectively filters out spikes on the NE signal before outputting the NEFLT signal.

The one-shot circuit (logic gate 706 with delay P 708) generates high state on its output, NE1SHOT signal, after td1S from rising edge of NEFLT signal, and holds the NE1SHOT signal at a high state for the Delay P period 708 before turns it to a low state.

The high state of NE1SHOT signal propagates to the IRXCLK signal 720 after a Delay S period 770 caused by the delay S 710. The high state of IRXCLK signal 720 resets the set-reset register 704 output, NEFLT signal, to low after $td_{RST}$. The high state of IRXCLK signal 720 also enables the register 714 for the SI signal value to be output to S signal. The comparator 702 detects when the S signal (symbol Sym1 760) and matches the symbol Sym1 756 of the SI signal, and turns its output, the NE signal, to low. The low state of NE1SHOT signal propagates to the IRXCLK signal 720 after a Delay period S 770 caused by the delay S 710.

When a new symbol value Sym2 752 is being received, it causes the SI signal to start changing its value to the next symbol Sym2 758 after $t_{HD}$ from the last falling (trailing) edge 768 of IRXCLK signal 720. The timing constraint for the symbol cycle period $t_{SYM}$ may be as follows:

$$td_{NE}+td_{1S}+\text{Delay } S+\text{Delay } P+t_{HD}<t_{SYM}.$$  (i)

More specifically, the symbol cycle time $t_{SYM}$ must be greater than total of: a Delay period S, a Delay Period P, $t_{HD}$, $td_{NE}$, $td_{1S}$ and $td_{RST}$. If the total of these six time periods exceeds the $t_{SYM}$ period, the trailing edge of IRXCLK overlaps the next symbol cycle, disabling the NEFLT signal from being set for the overlapping period. Note that the amount of overlapping period accumulates cycle by cycle and eventually results in an extra IRXCLK pulse in one symbol cycle. The timing constraint for the setup time $t_{SU}$ may be as follows:

$$\text{Max. skew spec}+t_{SU}<\text{Delay } S.$$  i)

b) More specifically, the delay period S must be less than the setup time $t_{SU}$ plus the maximum skew.

Figure 8:
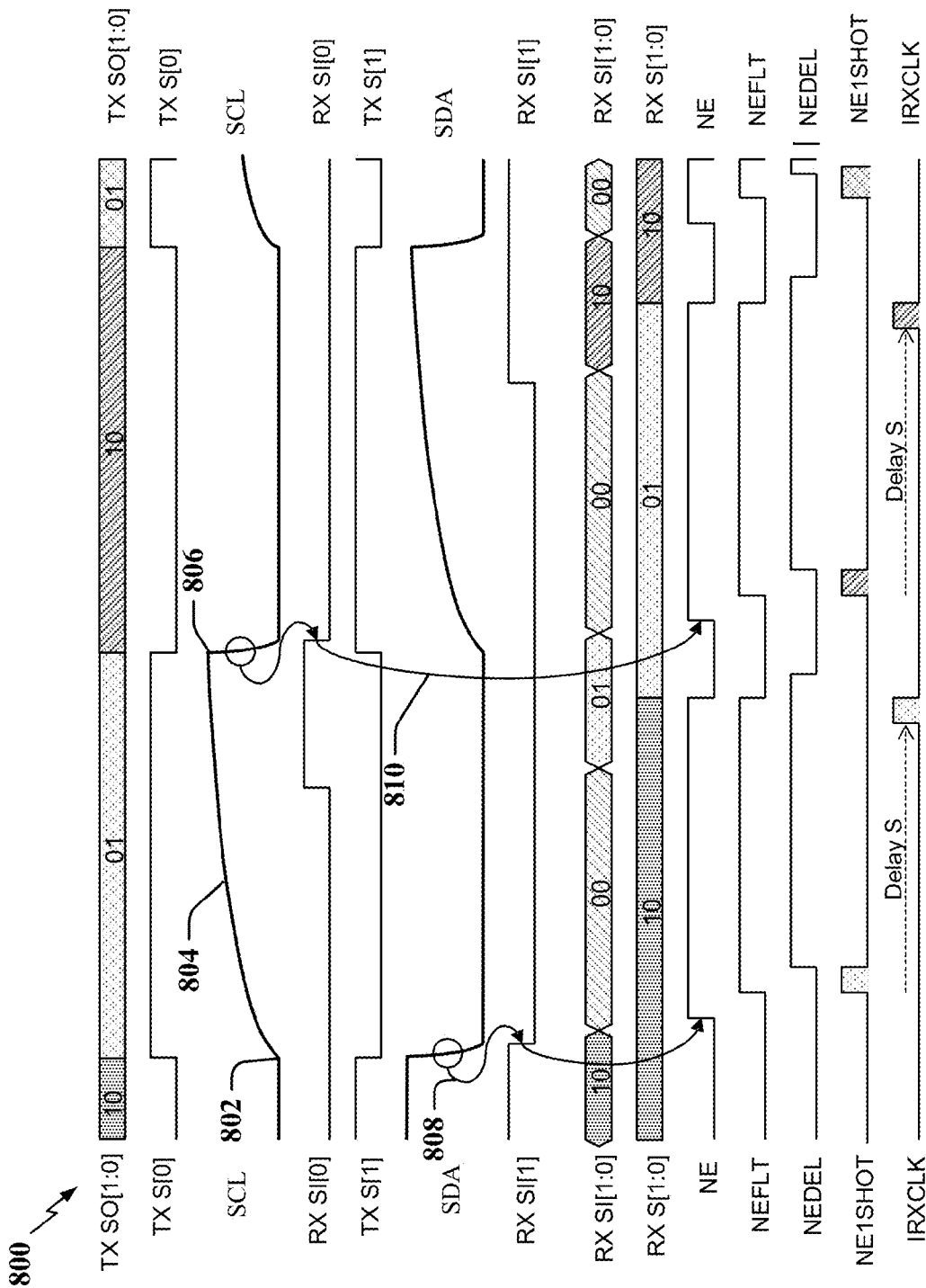
FIG. 8 is a diagram that illustrates timing associated with open-drain transistors as described in relation to the clock recovery circuit depicted in FIG. 7.

FIG. 8 is a diagram 800 that illustrates timing associated with open-drain transistors as described in relation to the clock recovery circuit 700 depicted in FIG. 7. A first transition 804 (low-to-high transition), beginning at time 802, illustrates a slow-rise time attributable to a pull-up on an open-drain transistor driver. A second transition 806 (high-to-low transition) is faster and attributable to a switched-on transistor driver. In this example, valid clock timing can be extracted because at least one negative transition occurs in the wires 703 (FIG. 7). For example, clock timing can be reliably extracted using transitions 808 and 810 from different wires 703 to generate subsequent clocks of a receiver clock, assuming that any delayed effect arising from slow transition 804 (e.g., long rise time) can be suppressed.

Figure 9:
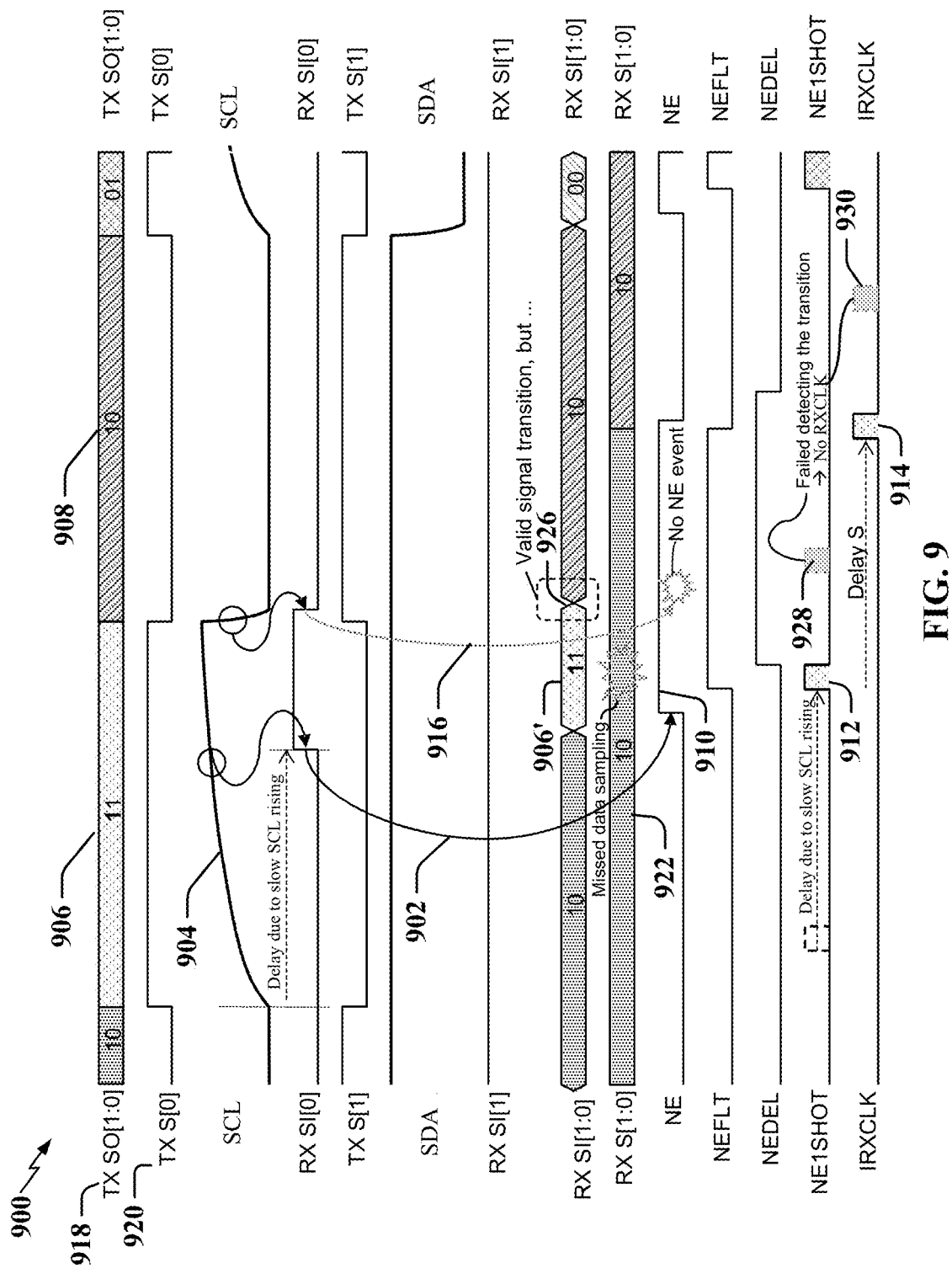
FIG. 9 illustrates timing issues associated with receivers of multi-wire open-drain link with symbol transition based clocking.

FIG. 9 is a diagram 900 that illustrates timing associated with open-drain transistor drivers. Here, clock timing relies on a single negative-to-positive or low-to-high transition 904 (e.g., rising edge) that is detected (at low-to-high transition 902) after a significant delay. As a result of the delayed detection, the receive clock extracted by a CDR circuit 700 may be disrupted and symbols may be missed due to incorrect sampling time. A stream of output symbols TX SO [1:0] 918 includes a first symbol 906 and a second symbol 908, where each symbol 906/908 is transmitted within a symbol transmission cycle. Here, TX S[0] indicates bit 0 of S[1:0]. A receiver buffer detects the signal rising transition 902 late in the first symbol 906 period because of the slow voltage transition 904. The NE (not equal) signal 910 and then NE1SHOT pulse 912 is generated much late time in the symbol cycle, after delay S time from that point IRXCLK is generated. It is quite probable that the IRXCLK is generated in the next symbol timing (i.e., during the second symbol 908) due to the extra delay. This may cause, for example, the IRXCLK pulse 914 to sample the signal SI of the next cycle (symbol 908) instead of the intended symbol 906 due to excessive delay. That is, detection of a transition 926 is missed because it occurs during a "Delay S" period of the previous transition so NEFLT has not been reset to 0. Missing this symbol transition 926 causes the receiver clock cycle 928 and 930 to be missed. The possibility of missing symbol transitions makes the recovered clock unpredictable and, consequently, unusable.

Figure 10:
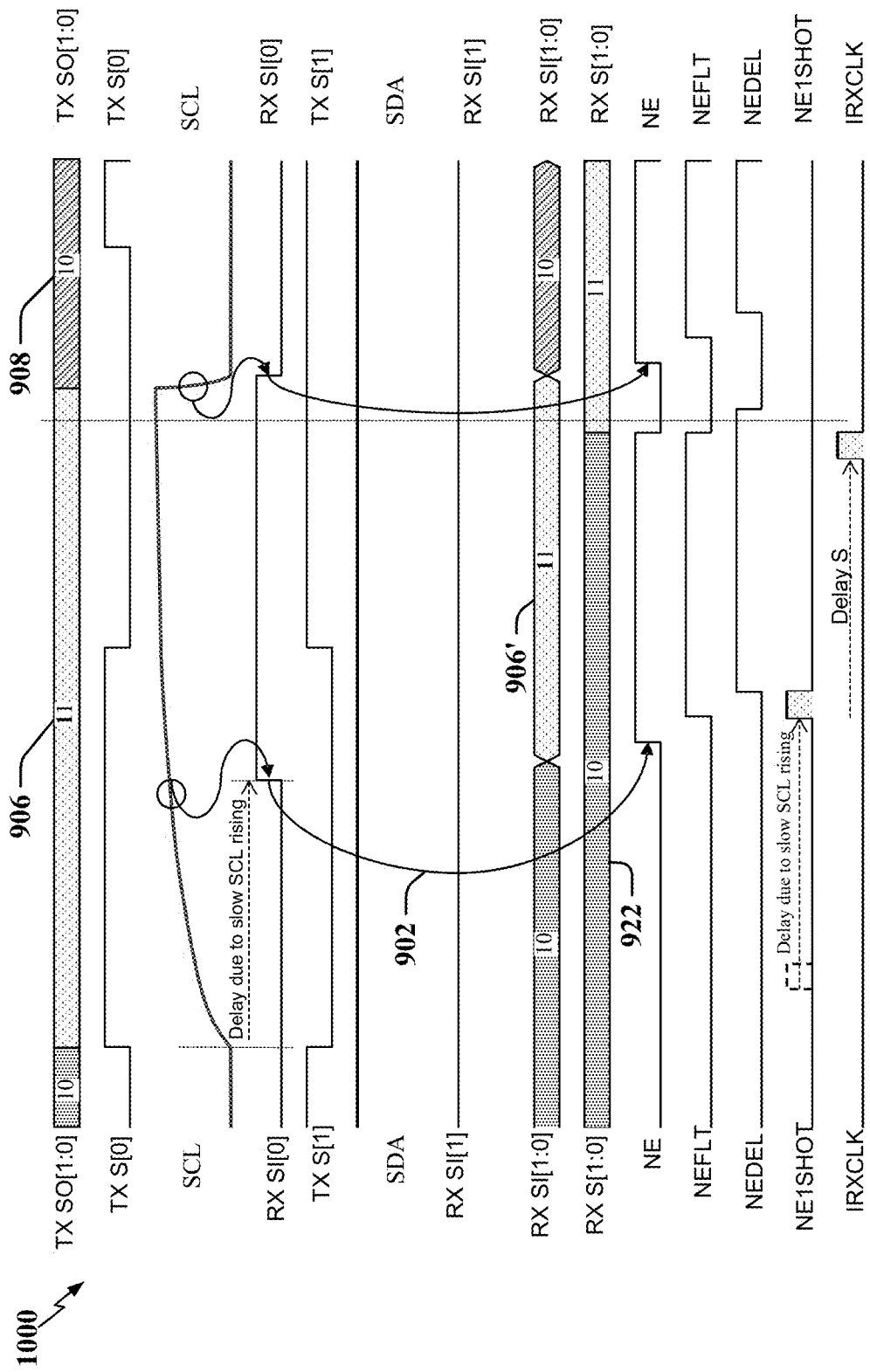
FIG. 10 illustrates a timing diagram in which the rise time delay of FIG. 9 may be accommodated by decreasing a frequency of operation of the data link of FIG. 1.

FIG. 10 illustrates a timing diagram 1000 in which the rise time delay of FIG. 9 may be accommodated by decreasing a frequency of operation of the data link (input bits 118 in FIG. 1). By slowing down the symbol rate/frequency (i.e., extending the symbol period), the first symbol 906 may be sampled rather than the next symbol 908. However, the approach of decreasing frequency is unsatisfactory because it degrades performance of the interface (i.e., slows down data throughput).

Exemplary Clock Data Recovery Circuit with Reliable Symbol Transition Sensing

Figure 11:
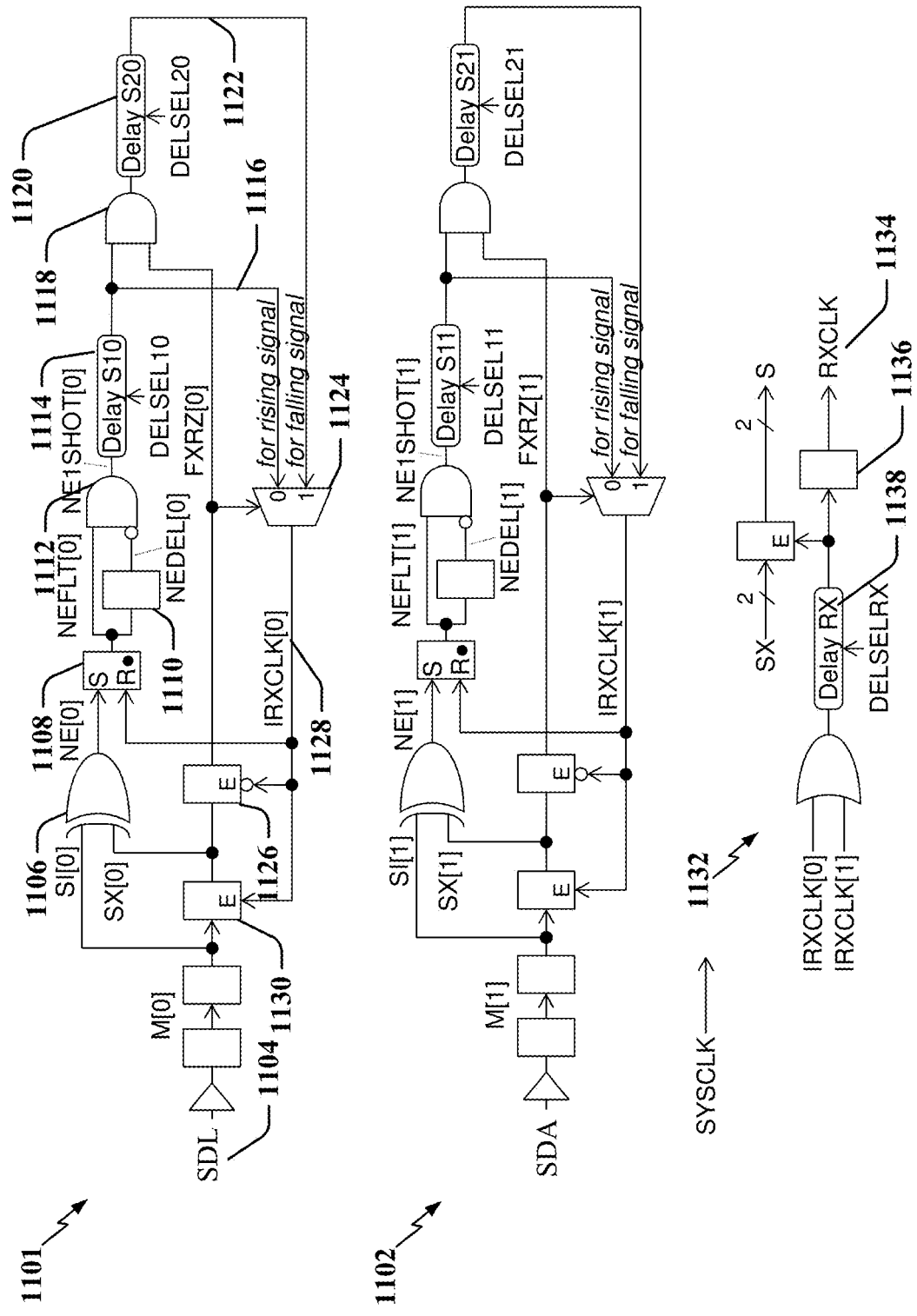
FIG. 11 is a diagram illustrating the use of a plurality of CDR circuits to generate reliable timing in accordance with certain aspects.

FIG. 11 is a diagram illustrating the use of a plurality of CDR circuits 1101 and 1102 to generate reliable timing in accordance with certain aspects. A CDR circuit 1101/1102 may be provided for every wire in the interface, and thus permitting clock/timing extraction for a single wire. Each CDR circuit 1101/1102 is configured to generate a pulse, which is aligned relative to a transition on input 1104. An exclusive-OR logic 1106 compares a change in state of input 1104 with the prior state maintained by a hold register 1130 and produces an output (NE) indicating whether a difference is detected. The NE signal is generated when the current state is not equal to a registered copy of the previous state (i.e., comparison of current symbol SI and previous symbol SX of a single signal line, SCL line 1104 or serial data (SDA) line). The output of the exclusive-or logic 1106 sets a set-reset register 1108 to record the transition. The output of the set-reset register 1108 is gated with an inverted delayed version of itself at gate 1112, to produce a one-shot pulse (NE1SHOT[0]). The inverted delayed version of the output of the set-reset register 1108 is an output of a flip-flop circuit 1110.

Two "Delay S" are used for each CDR circuit 1101/1102. A first delay S10 1114 is used for slow rising signals (i.e., low-to-high transitions), and a second delay S20 and 1120 is used for fast falling signals (i.e., high-to-low transitions). That is, the slow rising signals (i.e. low-to-high transitions) are exposed to an overall shorter delay (first delay S10 1114) while the faster falling signals (i.e., high-to-low transitions) are exposed to a longer overall delay (i.e., total delay of the two delays S10 1114 and S20 1120). Consequently, on a rising transition (low-to-high transition), the NE1SHOT[0] pulse is delayed by a time determined by the first delay S10 1114 to provide a resultant pulse 1116 that enables reliable sampling of the next symbol after a rising transition. On a falling transition (high-to-low transition), the pulse 1116 is further delayed by the second delay S20 1120, which is selected to match timing based on the rising edges (e.g., the second delay S20 1120 is selected to extend the falling transitions to match the rising transitions).

Each CDR circuit 1101/1102 comprises an additional, second delay circuit 1120 that operates to normalize the timing derived from rising (low-to-high) and falling (high-to-low) transitions. In particular, second delay circuit 1120 delays pulses 1116 generated by falling transitions (e.g., high-to-low transitions). The direction of the transition (e.g., low-to-high or high-lo-low) is known from the prior state of the wire (e.g., SCL line 1104), indicated by register 1126, which maintains a copy of the prior state. If the wire was at a high level, then a falling transition (i.e., high-to-low transition) will be the next detected transition and the gate 1118 is controlled to enable the pulse 1116 generated based on the transition to be provided to a second delay circuit 1120. Additionally, a multiplexer 1124 is used to select timing 1122 generated by the second delay circuit 1120 as the next receive clock when the transition is falling (i.e., high-to-low transition). If the prior signal state is at a low level, the operation of second delay circuit 1120 is disabled by operation of the gate 1118 and the multiplexer 1124 selects a timing output (pulse 1116) by the first delay circuit 1114. The second delay circuit 1120 may be programmed or configured to introduce a delay for high-to-low transitions (e.g., negative or falling transitions) that is equivalent to the delay caused by slower rising low-to-high transition. For instance, such delay for high-to-low transitions may be approximately equal to the difference between the rise time for a low-to-high transition and the fall time for a high-to-low transition.

A system receive clock 1134 may be obtained using a clock circuit 1132 that aggregates and/or combines the receive clocks IRXCLK[0] and IRXCLK[1] generated by all CDRs 1101/1102 and generates the system receive clock RXCLK 1134.

Figure 12:
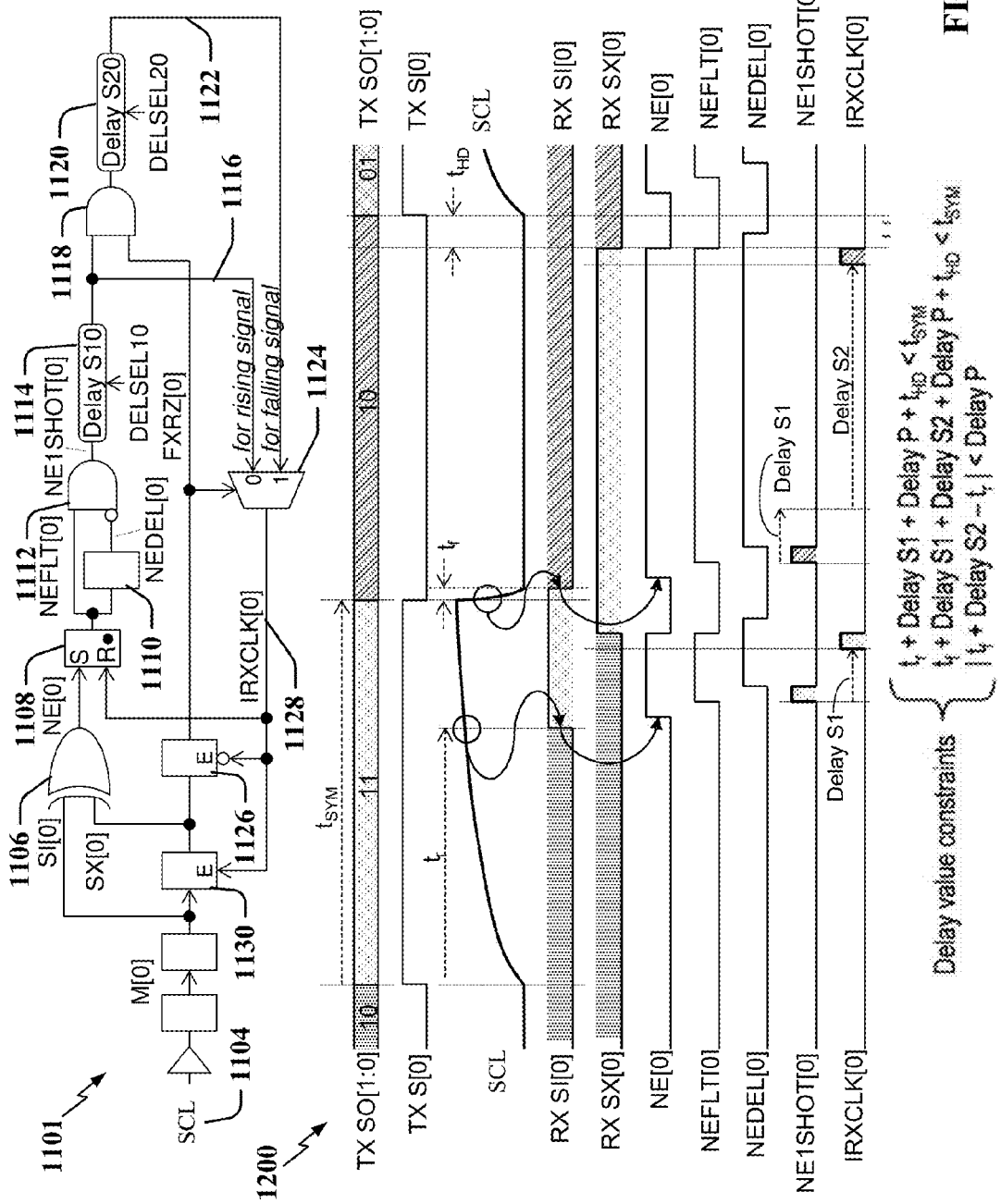
FIG. 12 is a timing diagram illustrating operation of a clock data and recovery circuit configured used with receivers of multi-wire open-drain link with symbol transition based clocking.

FIG. 12 is a timing diagram 1200 illustrates receive clock timing generated from a signal received from a single wire in a multi-wire open-drain link using the CDR circuit 1101 of FIG. 11. In the example, a receive clock may be generated with nearly equal timing for both rising transitions and falling transitions.

With further reference to FIG. 11, receiver CDR circuits 1101/1102 may be constructed from CMOS single-ended receivers that receive data encoded as symbols on an N-wire channel. Register 1130 stores the state of each wire at each IRXCLK[0] rising edge and generates previous state information for comparison by exclusive-or logic 1106. Delay elements 1114 and 1120 may be configured to obtain reliable clock transitions positioned to enable proper sampling of signal states received from wires 1104. The delay circuits 1114 and 1120 are serially deployed and selectively coupled to create a shorter delay for slow rising signal, and a longer delay for fast falling signal. In particular, the second delay 1120 is added to the serial chain of delays when a transition is associated with a fast falling signal. The IRXCLK clocks 1128 generated by a plurality of CDR circuits 1101/1102 are aggregated by the clock circuit 1132 to generate single-rate recovered receiver clock, RXCLK 1134.

Figure 13:
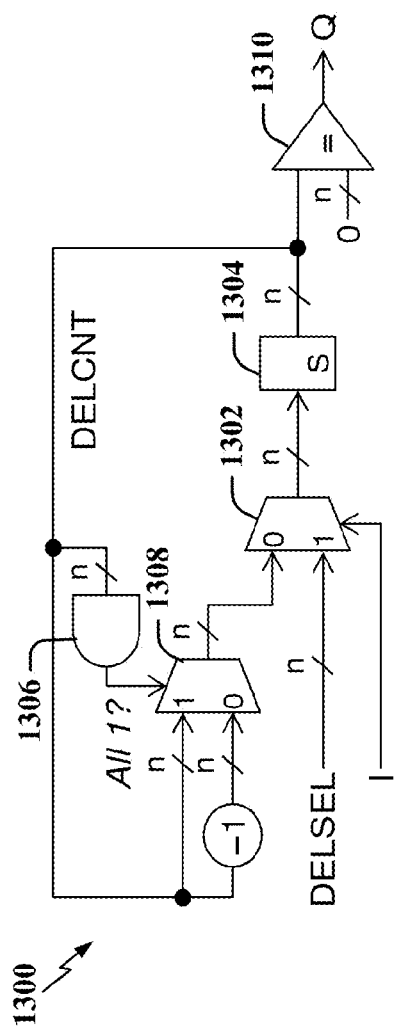
FIG. 13 is a simplified block schematic illustrating an example of a programmable delay circuit that may be used to implement one or more of delay elements within a CDR circuit.
Figure 13:
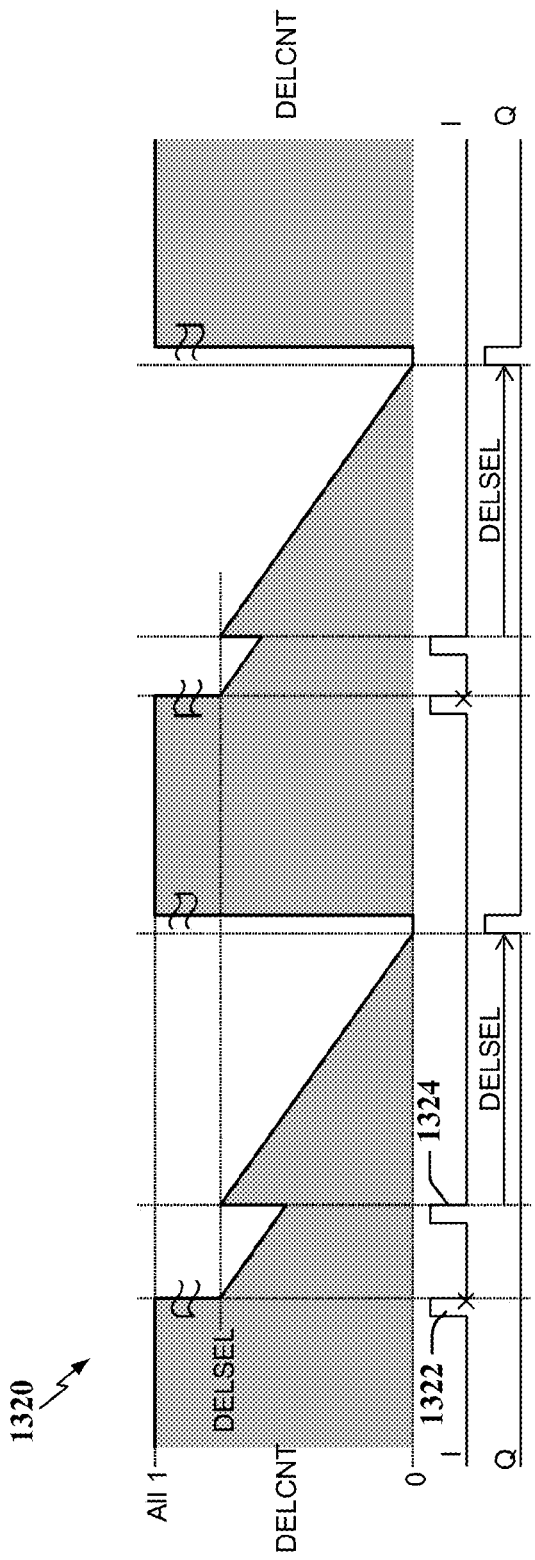

FIG. 13 is a simplified block schematic illustrating an example of a programmable delay circuit 1300 that may be used to implement one or more of delay elements 1114, 1120, and 1138 within a CDR circuit. This circuit 1300 implements a down counter that filters pulses. A delay select signal or value DELSEL may be fixed or programmable. A first multiplexer 1302 is enabled by an input I goes high, it starts a down counter. An n-bit flip-flop 1304 that holds the count value. A second multiplexer 1308 serves to decrease the count by 1 until the counter reaches 0. Then, a comparator 1310 compares the output count to zero and outputs Q=1 if the counter is equal to zero. Note that an AND gate 1006 causes the second multiplexer to stop counting down when zero is reached and then rolls over to all binary is ("1 . . . 111").

The diagram 1320 further illustrates that multiple pulses may also be filtered by the circuit 1300. For instance, if a first pulse 1322 starts the down counter, the occurrence of the second pulse 1324 causes the down counter to reset to the DELSEL value and restart. This effectively filters out unwanted multiple pulses and outputs a single pulse.

Figure 14:
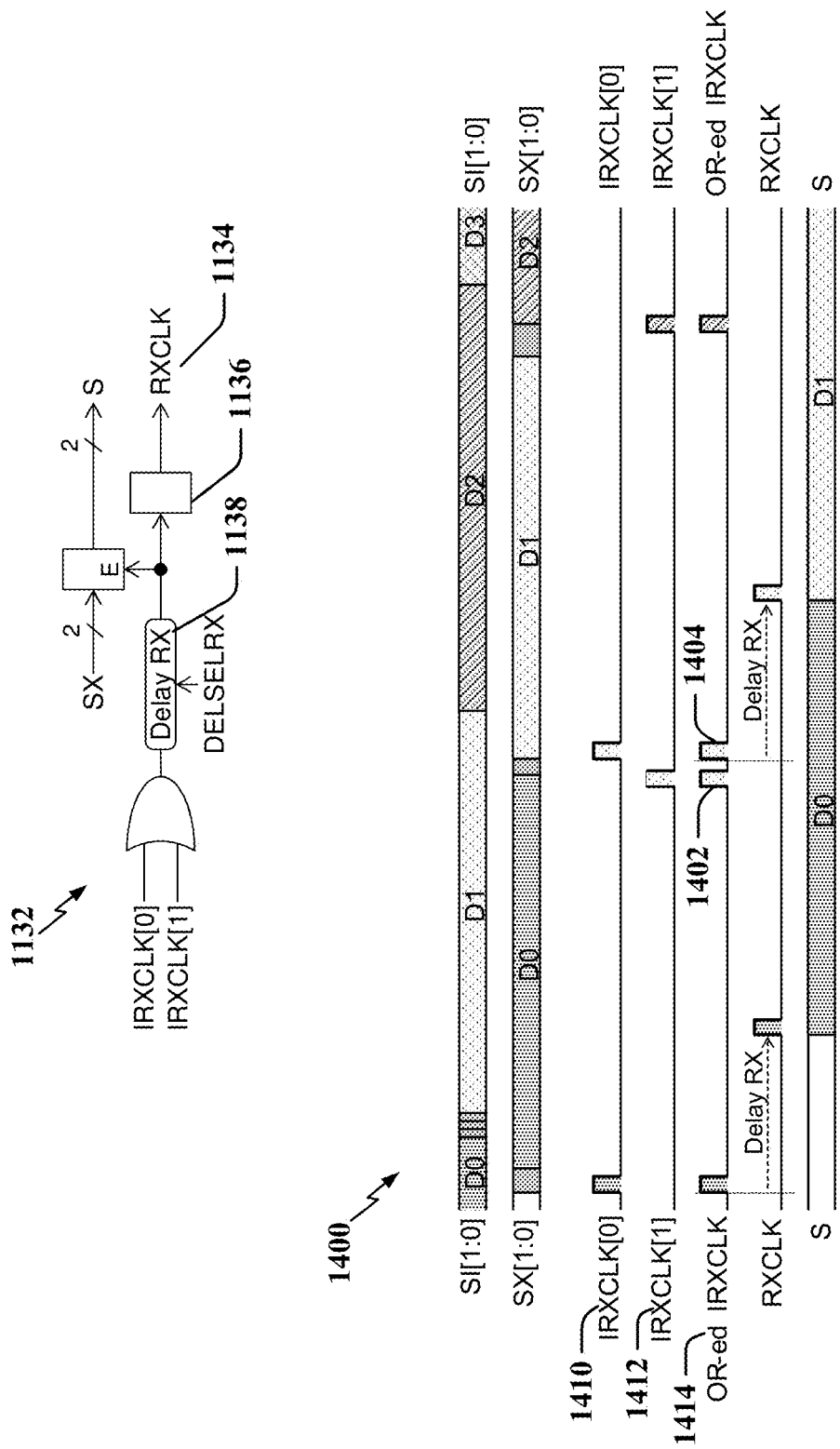
FIG. 14 illustrates the receive clock aggregation and sampling circuit of FIG. 11 along with a corresponding timing diagram.

FIG. 14 illustrates the receive clock aggregation and sampling circuit 1132 of FIG. 11 along with a corresponding timing diagram 1400. FIG. 14 illustrates an instance when delays for different CDR circuits 1101/1102 generate misaligned receive clocks 1410 and 1412, which can cause excess clock pulses 1402 and 1404. These pulses 1402 and 1404 may be filtered and/or combined by use of a delay RX 1138. The receiver clock RXCLK 1134 is generated by aggregating two clocks IRXCLKs (i.e., IRXCLK[0] 1410 and IRXCLK[1] 1412) and taking one shot from the trailing pulse of the OR-ed IRXCLKs 1414, delaying by the delay cell 1138 and a flip flop 1136. The received symbol SX may have some intermediate value between two symbols due to unmatched delays between the SCL CDR circuit 1101 and the SDA CDR circuit 1102, so the symbol SX is sampled a delay RX after each symbol boundary of SX when SX value is stable.

Figure 15:
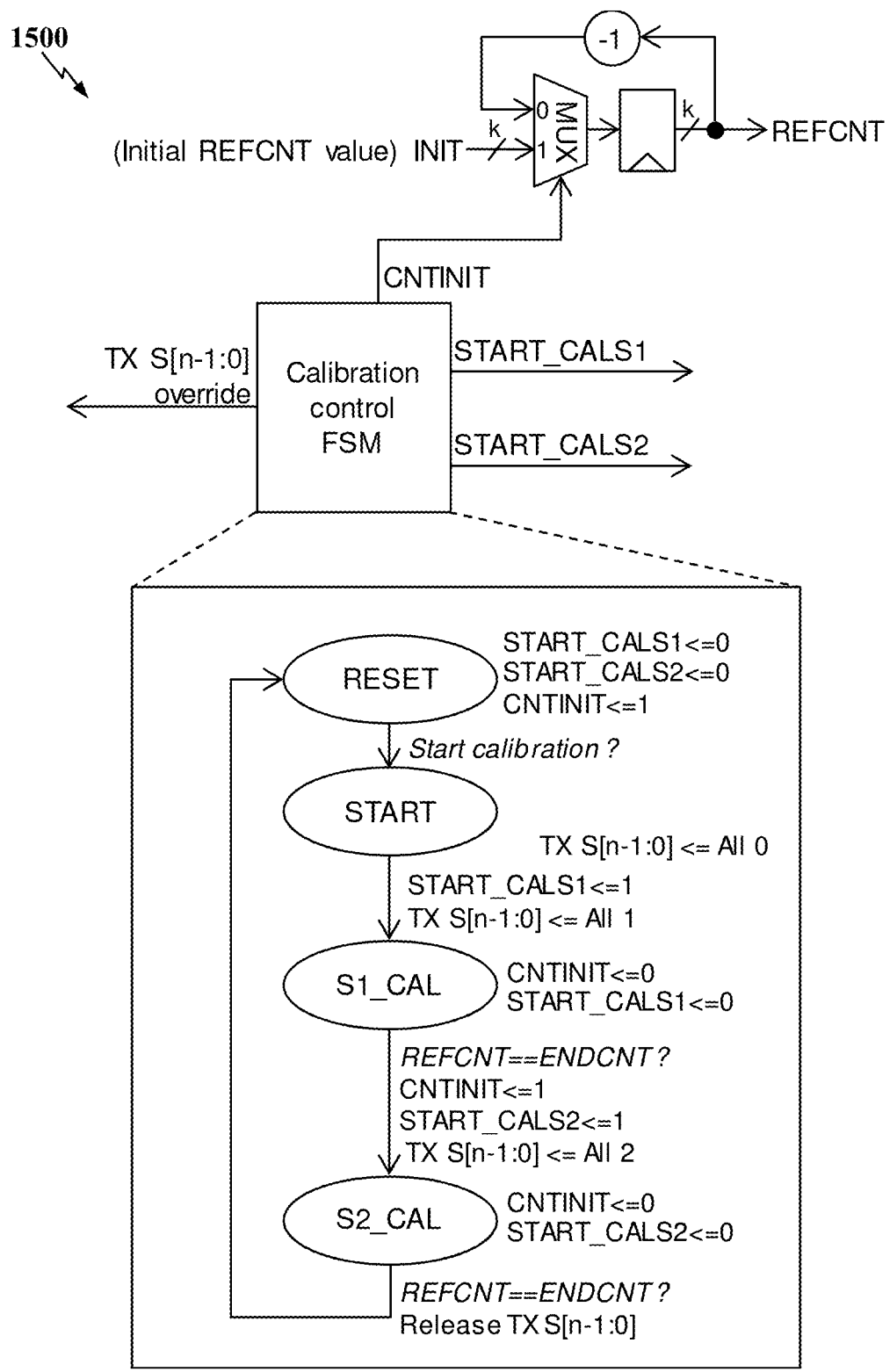
FIG. 15 illustrates a method for calibrating the timing of CDR circuits and an associated circuit used for calibration of one or more of delay circuits of FIG. 11.

FIG. 15 illustrates a method 1500 for calibrating the timing of CDR circuits 1101/1102 used for calibration of one or more of delay circuits 1114, 1120, and 1138 of FIG. 11. This method 1500 may serve to calibrate the clock signals from a plurality of CDRs so that they reliably overlap and thereby avoid generation of multiple pulses on receive clock RXCLK 1128 within a symbol interval.

Figure 16:
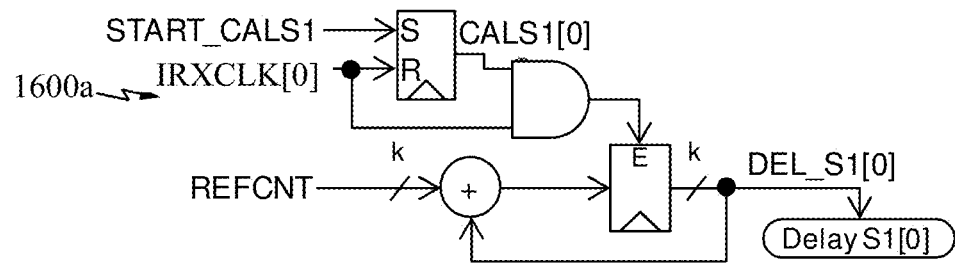
FIG. 16 illustrates logic circuits used to perform the calibration of one or more of delay circuits using the method of FIG. 15.
Figure 16:
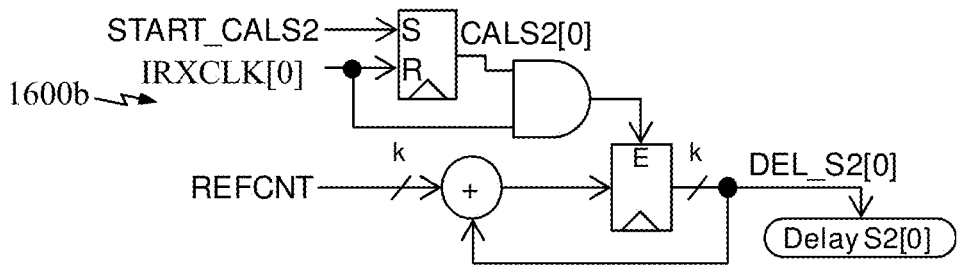
Figure 16:
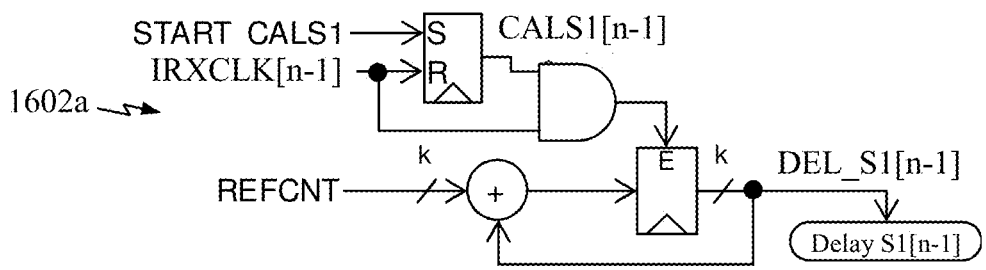
Figure 16:
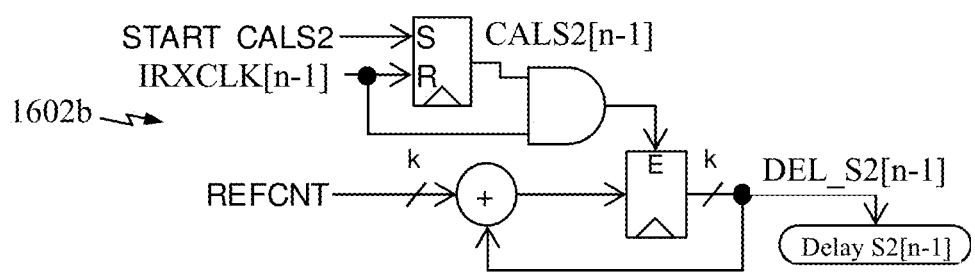

FIG. 16 illustrates logic circuits used to perform the calibration of one or more of delay circuits using the method of FIG. 15. This example illustrates a first logic circuit 1600*a* that serves to calibrate for a first delay or interval used by a CDR circuit (e.g., delay S1 1114 in FIG. 11). A second logic circuit 1600*b* (or the first logic circuit 1600*a*) may serve to calibrate for a second delay or interval used by the CDR circuit (e.g., delay S2 1120 in FIG. 11). Similarly, the delays for other CDR circuits (e.g., for different wires) may be calibrated using logic circuit(s) 1602*a*/1602*b*.

Figure 17:
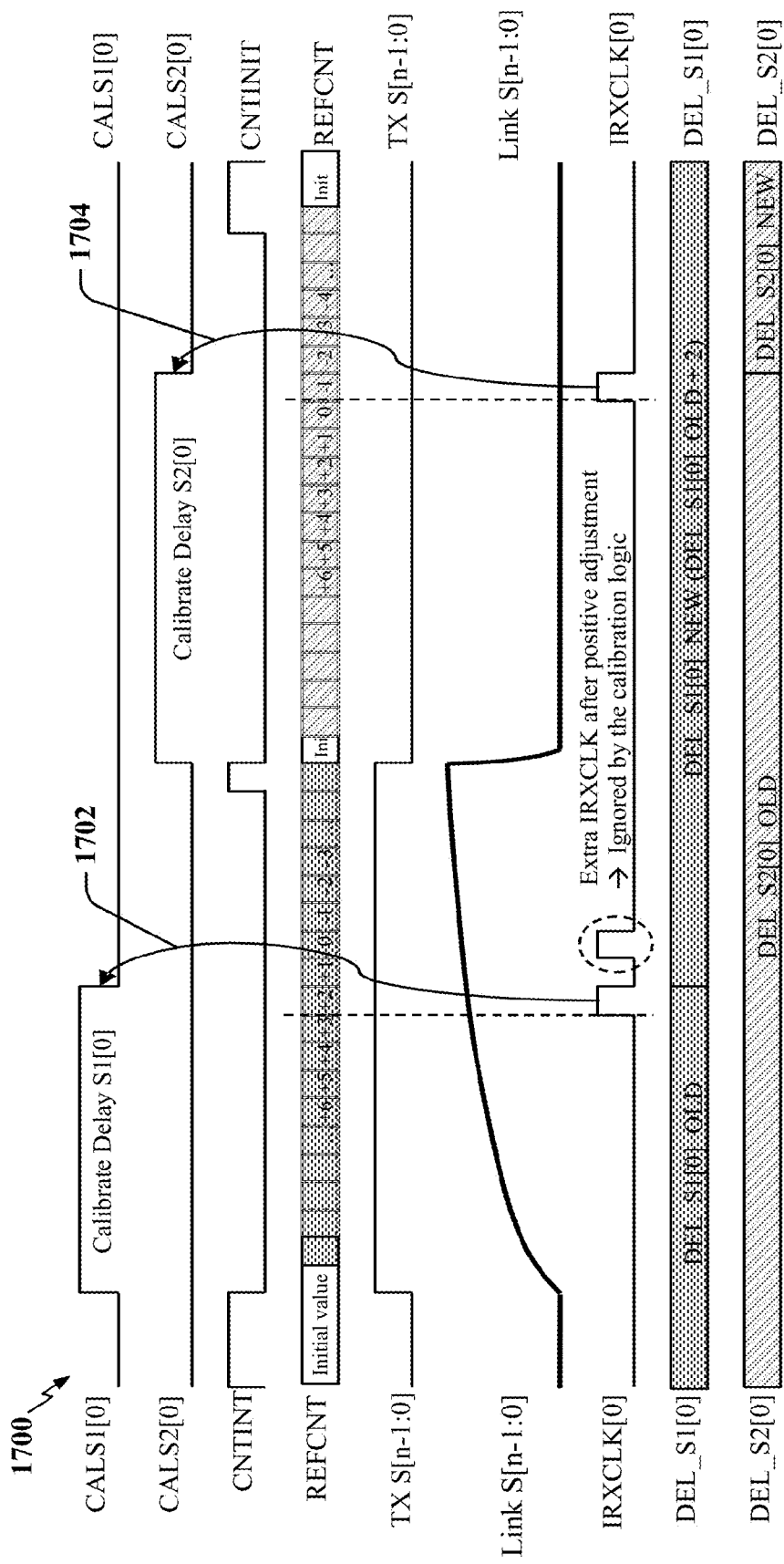
FIG. 17 includes a timing diagram illustrating an implementation of a calibration circuit for calibrating the delay circuits of FIG. 11.

FIG. 17 includes a timing diagram 1600 illustrating an implementation of a calibration circuit 1600*a* and 1600*b* for calibrating the delay circuits 1114, 1120 and/or 1138 of FIG. 11. In one example, the delays 1114 and 1120 are calibrated to adjust timing of clock signals generated on rising and falling edges of an input signal 1104.

In the example, calibration commences by providing a first falling transition (high-to-low transition). An initial calibration delay may be configured for the combination of delay circuits 1114 and 1120. The clock IRXCLK 1128 generated by the CDR circuit 1101 can be expected to produce a pulse after the first (falling) transition that reflects the delay of the first delay circuit 1114, which applies a delay on both falling transitions (i.e., high-to-low transitions) and rising transitions (i.e., low-to-high transitions). In one example, one or more of the delays associated with delay circuits 1114 and 1120 are calibrated during the calibration process based on observed differences in delays corresponding to the difference between fall time in falling transitions (high-to-low transitions) and rise time in rising transitions (low-to-high transitions) of the signal wire. The relationship 1702 between the end of the calibration delay and the arrival of the pulse associated with the first transition is examined to determine whether the calibration delay is to be increased or decreased by a number of delay clock cycles. The calibration delay is then modified as needed and used to program the delay circuit 1114.

A second falling transition (high-to-low transition) may also be provided as part of the calibration process. The second delay circuit 1120 is enabled for the second falling transition (high-to-low transition) when open-drain link delays between an SCL CDR circuit 1101 and an SDA CDR circuit 1102, so the symbol SX is sampled delay RX after each symbol boundary of SX when SX value is stable.

The relationship 1604 between the end of the calibration delay and the arrival of a pulse on the clock IRXCLK[0] 1128 may be used to further adjust the calibration delay value. This further adjusted value may then be used to program delay circuit 1120, and normal operation can be established.

Calibration may be performed after power-on events or when changes in interface characteristics require recalibration. For example, changes in ambient temperature may affect the RC constant associated with the interface wires 1104, including variations in pull-up resistance values.

During calibration, the transmitter may be overridden to produce a calibration signal pattern, comprising a first (rising) transition of logic 0 to logic 1 (i.e., low-to-high transition), followed by a second (falling) transition from logic 1 to logic 0 transition (i.e., high-to-low transition). The transmitter may be placed in an offline mode and a calibration circuit 366 (see FIG. 3) may introduce a calibration signal through a gate 370 in receive device 362' (FIG. 3). A reference counter may be initialized at each transition in the calibration signal. For example, in a first calibration step, the reference counter may be used to calibrate the delay circuit 1114, whereby the reference counter is expected to expire when a pulse is expected after a positive transition, as indicated by the relationship 1602 shown in FIG. 16. The delay circuit 1114 may be calibrated at the conclusion of the first step by adding any remaining value in the reference counter to the programmed delay for delay circuit 1114, where the reference counter has a signed value. In a second step, the reference counter may be used to calibrate delay 1120, whereby the reference counter is expected to expire when a pulse is expected after a negative transition is detected and after the delay introduced by the delay circuit 1120, as indicated by the relationship 1604 shown in FIG. 16. Delay circuit 1120 may be calibrated at the conclusion of the second step by adding any remaining value in the reference counter to the delay programmed in delay circuit 1120, where the reference counter has a signed value time.

Figure 18:
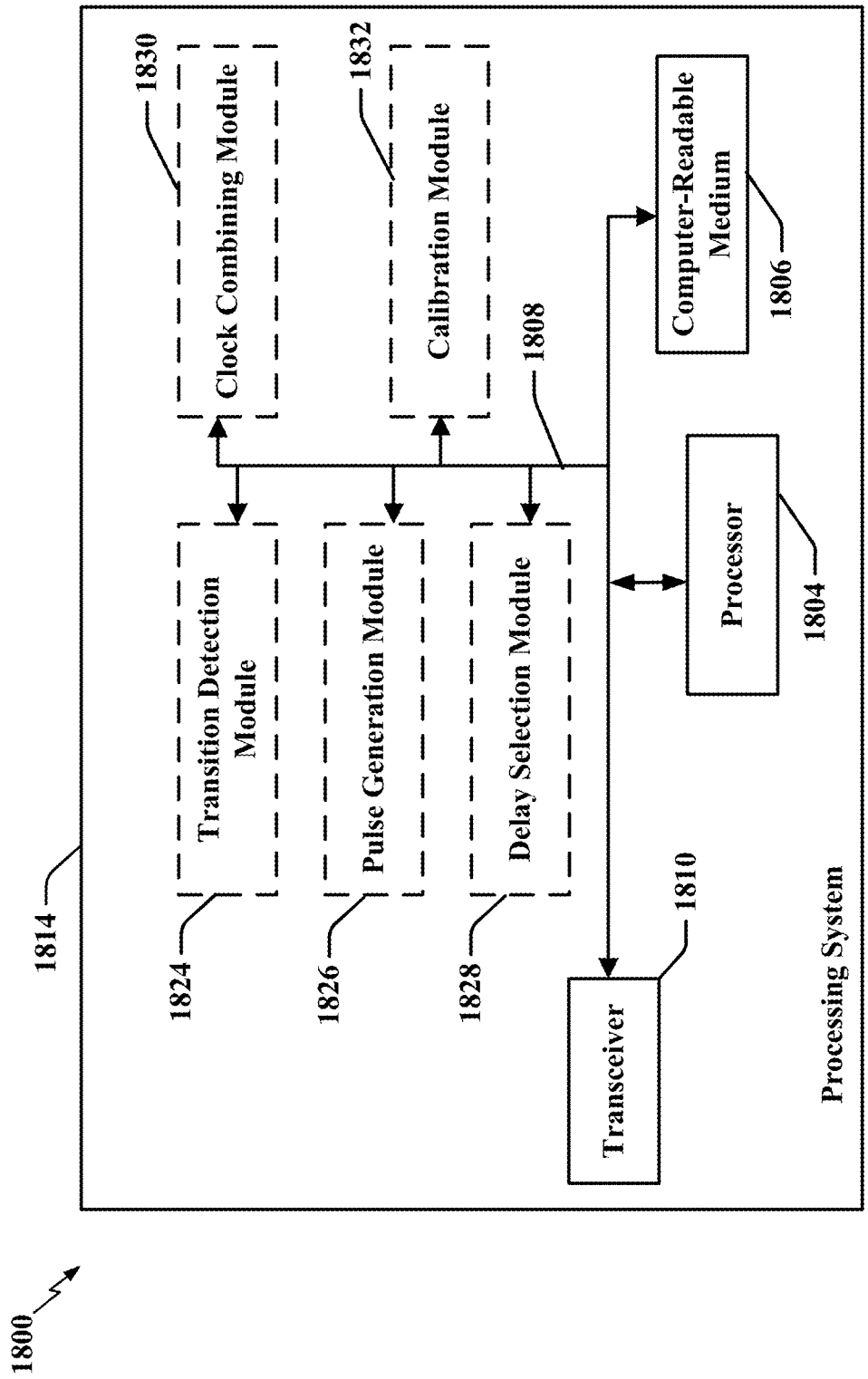
FIG. 18 is a diagram illustrating an example of a hardware implementation for an apparatus that employs a clock extraction circuit.

FIG. 18 is a diagram 1800 illustrating an example of a hardware implementation for an apparatus employing a processing system 1814. The processing system 1814 may be a consumer or generator of data transmitted on a multi-wire open-drain link with symbol transition based clocking. In one example, the processing system 1814 may be configured to calibrate the delay circuits 1114 and 1120 as described in relation to FIG. 11. The processing system may configure other aspects of the multi-wire open-drain link, including a data rate of the multi-wire open-drain link.

The processing system 1814 may be implemented with a bus architecture, represented generally by the bus 1808. The bus 1808 may include any number of interconnecting buses and bridges depending on the specific application of the processing system 1814 and the overall design constraints. The bus 1808 links together various circuits including one or more processors and/or hardware modules, represented by the processor 1804, the modules 1824, 1826, 1828, 1830 and 1832 and the computer-readable medium 1806. The bus 1808 may also link various other circuits such as timing sources, peripherals, voltage regulators, and power management circuits, which are well known in the art, and therefore, will not be described any further.

The processing system 1814 may be coupled to a transceiver 1810. The transceiver 1810 provides a means for communicating with various other apparatus over a transmission medium. The processing system 1814 includes a processor 1804 coupled to a computer-readable medium 1806. The processor 1804 is responsible for general processing, including the execution of software stored on the computer-readable medium 1806. The software, when executed by the processor 1804, causes the processing system 1814 to perform the various functions described supra for any particular apparatus. The computer-readable medium 1806 may also be used for storing data that is manipulated by the processor 1804 when executing software. The processing system further includes at least one of the modules 1824, 1826, 1828, 1830 and 1832. The modules may be software modules running in the processor 1804, resident/stored in the computer readable medium 1806, one or more hardware modules coupled to the processor 1804, or some combination thereof.

In one configuration, the apparatus includes means 1824 for detecting transitions on a signal wire, means 1826 for generating a pulse in response to detection of a transition, means 1828 for selectively applying a delay to the pulse based on the type of transition detected, means 1830 for combining pulses generated for multiple wires, and means 1832 for calibrating the delay. The aforementioned means may be one or more of the aforementioned modules of the apparatus 1802 and/or the processing system 1814 of the apparatus 1802 configured to perform the functions recited by the aforementioned means.

FIG. 19 illustrates a method for reliably generating a clock signal from symbol transitions. A transition in a signal received from a communication interface is determined, ascertained, and/or sensed 1902. A clock pulse responsive to the transition is generated 1904. The clock pulse is delayed by a preconfigured first interval (first delay) if the transition is in a first direction 1906. If the transition is in a second direction, the method may delay the clock pulse by a preconfigured second interval (second delay) 1908. In one example, where the first direction is a rising transition and the second direction is a falling transition, the second interval may be selected so that a clock pulse fall time plus the first interval plus the second interval are approximately equal to a clock pulse rise time plus the first interval.

The clock pulse may restart if a different clock pulse is received and the delay of the clock pulse has not been completed. In one example, the preconfigured first and/or second intervals may be configured based on a rise time and a fall time associated with the communication interface, and the rise time corresponds to a rise time associated with an open-drain transistor. For instance, the preconfigured first and/or second intervals may be selected to cause the clock pulse to occur when a symbol is transmitted on the communication interface, thereby permitting the symbol to be reliably sampled. In another instance, the preconfigured second interval may be selected to match a delay in detecting the transition attributed to the clock pulse rise time. The preconfigured first interval may be selected to match a delay in detecting the transition attributed to a clock pulse fall time.

The method may further include aggregating the clock pulse with at least one additional clock pulse generated in response to the transition 1910. As illustrated in the sampling and aggregation clock circuits 1132 (FIG. 11 and FIG. 14), the clock pulses from two or more different CDRs may be calibrated so that they are approximately synchronized. Additionally, the method comprises calibrating the preconfigured first and/or second intervals 1912.

In one example, calibrating the preconfigured first and/or second intervals may include: (a) providing first and second calibration transitions that are in different directions from one another; (b) measuring respective delays associated with clock pulses generated for the first and second calibration transitions; and/or (c) modifying the preconfigured first and/or second intervals to minimize a difference in the respective delays. Modifying the preconfigured first and/or second intervals may include: (a) adjusting a programmed delay of a first delay circuit based on a measured delay associated with a clock pulse generated after the first calibration transition; and/or (b) adjusting a programmed delay of a second delay circuit based on a measured delay associated with a clock pulse generated after the second calibration transition. The respective delays are measured using a timer that reflects a desired delay associated with clock pulses generated for either calibration transition.

It is understood that the specific order or hierarchy of steps in the processes disclosed is an illustration of exemplary approaches. Based upon design preferences, it is understood that the specific order or hierarchy of steps in the processes may be rearranged. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method for generating a clock signal, comprising:
   receiving one or more signals from a multi-wire communication interface, wherein a sequence of symbols is encoded in the one or more signals;
   determining a first transition in the one or more signals, wherein the first transition comprises a rising edge;
   generating a first clock pulse on the clock signal responsive to the first transition and after a preconfigured first interval provided by delaying the first clock pulse using a first delay circuit;
   determining a second transition in the one or more signals, wherein the second transition comprises a falling edge; and
   generating a second clock pulse on the clock signal responsive to the second transition and after a preconfigured second interval provided by delaying the second clock pulse using a second delay circuit,
   wherein the preconfigured first interval and the preconfigured second interval have different durations.

2. The method of claim 1, wherein the preconfigured first and/or second intervals are selected to cause the clock pulse to occur when a symbol is transmitted on the communication interface, thereby permitting the symbol to be reliably sampled.

3. The method of claim 1, wherein the preconfigured first and/or second intervals are configured based on a rise time and a fall time associated with the communication interface, and the rise time corresponds to a rise time associated with an open-drain transistor.

4. The method of claim 3, wherein the preconfigured second interval is selected to match a first delay that is associated with the rise time.

5. The method of claim 4, wherein the preconfigured first interval is selected to match a second delay that is associated with the fall time.

6. The method of claim 1, further comprising aggregating the first clock pulse with at least one additional clock pulse generated in response to the first transition.

7. The method of claim 1, further comprising calibrating the preconfigured first and/or second intervals.

8. The method of claim 1, further comprising:
   providing a rising calibration transition on the communication interface;
   measuring a first delay associated with a first calibration clock pulse generated from the rising calibration transition;
   providing a falling calibration transition on the communication interface;

measuring a second delay associated with a second calibration clock pulse generated from the falling calibration transition; and modifying at least one preconfigured interval by an amount calculated to minimize a difference between the first delay and the second delay.

9. The method of claim 8, wherein modifying the at least one preconfigured interval comprises:

adjusting a programmed delay of the first delay circuit based on a measured delay associated with the first calibration clock pulse; and adjusting a programmed delay of the second delay circuit based on a measured delay associated with the second calibration clock pulse.

10. The method of claim 8, wherein modifying the at least one preconfigured interval comprises:

using a timer that reflects a desired delay associated with the first calibration clock pulse and the second calibration clock pulse.

11. An apparatus for generating a clock signal, comprising:

means for receiving one or more signals from a multi-wire communication interface, wherein a sequence of symbols is encoded in the one or more signals;

means for determining a first transition in the one or more signals, wherein the first transition comprises a rising edge;

means for generating a first clock pulse on the clock signal responsive to the first transition and after a preconfigured first interval;

means for delaying the first clock pulse by the preconfigured first interval, the means for delaying the first clock pulse including a first delay circuit;

means for determining a second transition in the one or more signals, wherein the second transition comprises a falling edge;

means for generating a second clock pulse on the clock signal responsive to the second transition and after a preconfigured second interval; and means for delaying the second clock pulse by the preconfigured second interval, the means for delaying the second clock pulse including a second delay circuit, wherein the preconfigured first interval and the preconfigured second interval have different durations.

12. The apparatus of claim 11, wherein the preconfigured first and/or second intervals are selected to cause the clock pulse to occur when a symbol is transmitted on the communication interface, thereby permitting the symbol to be reliably sampled.

13. The apparatus of claim 11, wherein the preconfigured first and/or second intervals are configured based on a rise time and a fall time associated with the communication interface, and the rise time corresponds to a rise time associated with an open-drain transistor.

14. The apparatus of claim 13, wherein the preconfigured second interval is selected to match a first delay that is associated with the rise time.

15. The apparatus of claim 14, wherein the preconfigured first interval is selected to match a second delay that is associated with the fall time.

16. The apparatus of claim 11, further comprising means for aggregating the first clock pulse with at least one additional clock pulse generated in response to the first transition.

17. The apparatus of claim 11, further comprising means for calibrating the preconfigured first and/or second intervals.

18. The apparatus of claim 17, wherein the means for calibrating the preconfigured first and/or second intervals is configured to:

respond to first and second calibration transitions that are in different directions from one another by measuring respective delays associated with clock pulses generated for the first and second calibration transitions, and modify the preconfigured first and/or second intervals to minimize a difference in the respective delays.

19. The apparatus of claim 18, wherein the means for calibrating the preconfigured first and/or second intervals adjusts a programmed delay of the first delay circuit based on a measured delay associated with a first calibration clock pulse, and adjusts a programmed delay of the second delay circuit based on a measured delay associated with a second calibration clock pulse.

20. The apparatus of claim 18, wherein the respective delays are measured using a timer that reflects a desired delay associated with a first calibration clock pulse and a second calibration clock pulse.

21. An apparatus for generating a clock signal, comprising:

a processing system configured to:

receive one or more signals from a multi-wire communication interface, wherein a sequence of symbols is encoded in the one or more signals;

determine a first transition in the one or more signals, wherein the first transition comprises a rising edge;

generate a first clock pulse on the clock signal responsive to the first transition after a preconfigured first interval provided by delaying the first clock pulse using a first delay circuit; and determine a second transition in the one or more signals, wherein the second transition comprises a falling edge generate a second clock pulse on the clock signal responsive to the second transition after a preconfigured second interval provided by delaying the second clock pulse using a second delay circuit, wherein the preconfigured first interval and the preconfigured second interval have different durations.

22. The apparatus of claim 21, wherein the preconfigured first and/or second intervals are selected to cause the clock pulse to occur when a symbol is transmitted on the communication interface, thereby permitting the symbol to be reliably sampled.

23. The apparatus of claim 21, wherein the preconfigured first and/or second intervals are configured based on a rise time and a fall time associated with the communication interface, and the rise time corresponds to a rise time associated with an open-drain transistor.

24. The apparatus of claim 23, wherein the preconfigured second interval is selected to match a first delay that is associated with the rise time.

25. The apparatus of claim 24, wherein the preconfigured first interval is selected to match a second delay that is associated with the fall time.

26. The apparatus of claim 21, wherein the processing system is configured to aggregate the first clock pulse with at least one additional clock pulse generated in response to the first transition.

27. The apparatus of claim 21, wherein the processing system is configured to calibrate the preconfigured first and/or second intervals.

28. The apparatus of claim 21, wherein the processing system is configured to:

provide a rising calibration transition on the communication interface;

measure a first delay associated with a first calibration clock pulse generated from the rising calibration transition;

provide a falling calibration transition on the communication interface;

measure a second delay associated with a second calibration clock pulse generated from the falling calibration transition; and modify at least one preconfigured interval by an amount calculated to minimize a difference between the first delay and the second delay.

29. The apparatus of claim 28, wherein the processing system is configured to modify the at least one preconfigured interval by:

adjusting a programmed delay of the first delay circuit based on a measured delay associated with the first calibration clock pulse; and adjusting a programmed delay of the second delay circuit based on a measured delay associated with the second calibration clock pulse.

30. The apparatus of claim 28, wherein the processing system is configured to modify the at least one preconfigured interval using a timer that reflects a desired delay associated with the first calibration clock pulse and the second calibration clock pulse.

31. A non-transitory processor-readable storage medium having one or more instructions stored thereon, wherein when executed by at least one processing circuit, the one or more instructions cause the at least one processing circuit to:

receive one or more signals from a multi-wire communication interface, wherein a sequence of symbols is encoded in the one or more signals;

determine a first transition in the one or more signals, wherein the first transition comprises a rising edge;

generate a first clock pulse on a clock signal responsive to the first transition after a preconfigured first interval provided by delaying the first clock pulse using a first delay circuit; and determine a second transition in the one or more signals, wherein the second transition comprises a rising edge;

generate a second clock pulse on the clock signal responsive to the second transition after a preconfigured second interval provided by delaying the second clock pulse using a second delay circuit, wherein the preconfigured first interval and the preconfigured second interval have different durations.

* * * * *